United States Patent
Aoyama et al.

(10) Patent No.: US 8,981,212 B2
(45) Date of Patent: Mar. 17, 2015

(54) POLYESTER FILM, LAMINATED FILM, SOLAR BATTERY BACKSHEET AND SOLAR BATTERY

(75) Inventors: Shigeru Aoyama, Otsu (JP); Ayako Shimazu, Otsu (JP); Atsushi Shiomi, Otsu (JP); Kozo Takahashi, Otsu (JP)

(73) Assignee: Toray Industries, Inc. (JP)

( * ) Notice: Subject to any disclaimer, the term of this patent is extended or adjusted under 35 U.S.C. 154(b) by 678 days.

(21) Appl. No.: 13/376,287

(22) PCT Filed: Jun. 2, 2010

(86) PCT No.: PCT/JP2010/059322
§ 371 (c)(1),
(2), (4) Date: Dec. 13, 2011

(87) PCT Pub. No.: WO2010/140611
PCT Pub. Date: Dec. 9, 2010

(65) Prior Publication Data
US 2012/0080089 A1 Apr. 5, 2012

(30) Foreign Application Priority Data
Jun. 5, 2009 (JP) .................. 2009-135832

(51) Int. Cl.
*H01L 31/00* (2006.01)
*B32B 5/16* (2006.01)
*C08J 5/18* (2006.01)
*H01L 31/048* (2014.01)

(52) U.S. Cl.
CPC ............... *C08J 5/18* (2013.01); *H01L 31/0481* (2013.01); *H01L 31/0487* (2013.01); *C08J 2367/02* (2013.01); *Y02E 10/52* (2013.01)
USPC ......................................... 136/259; 428/327

(58) Field of Classification Search
USPC .......................................................... 136/259
See application file for complete search history.

(56) References Cited

U.S. PATENT DOCUMENTS 8,580,377 B2 * 11/2013 Zhao et al. .................... 428/336

FOREIGN PATENT DOCUMENTS

| JP | 60-031526 A | 2/1985 |
|---|---|---|
| JP | 2-163155 A | 6/1990 |
| JP | 2-191638 A | 7/1990 |
| JP | 9-216951 A | 8/1997 |
| JP | 9-227767 A | 9/1997 |
| JP | 11-506487 A | 6/1999 |
| JP | 2002-088259 A | 3/2002 |
| JP | 2003-155403 A | 5/2003 |
| JP | 2007-070430 A | 3/2007 |
| JP | 2007-177034 A | 7/2007 |
| JP | 2007-302878 A | 11/2007 |
| WO | 2005/026241 A1 | 3/2005 |
| WO | 2009/069742 A1 | 6/2009 |

* cited by examiner

*Primary Examiner* — Hui Chin
(74) *Attorney, Agent, or Firm* — DLA Piper LLP (US)

(57) ABSTRACT

A polyester film includes particles and two kinds of crystalline polyester resins in which a sea-island structure is formed, wherein, if a crystallization temperature of a crystalline polyester resin A that forms a continuous phase or matrix phase in the polyester film is represented by TccA and a crystallization temperature of a crystalline polyester resin B that forms a dispersion phase or domain phase in the polyester film is represented by TccB, expression (1) below is satisfied, and a degree of flatness of the dispersion phase is 3 or more, and 70% or more of a total number of the particles present in the dispersion phase or are in contact with the dispersion phase:

$$TccA - TccB \geq 5° C. \quad \text{Expression (1).}$$

9 Claims, 1 Drawing Sheet

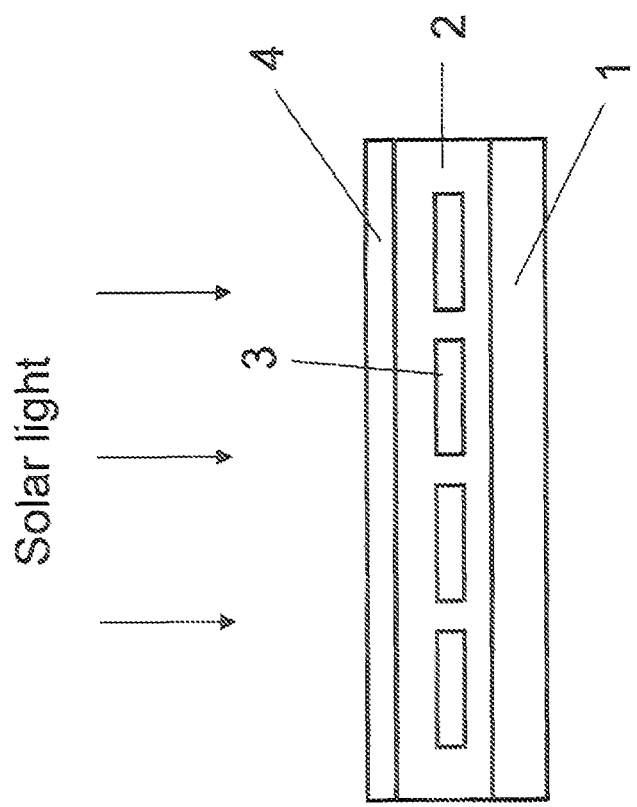

US 8,981,212 B2

POLYESTER FILM, LAMINATED FILM, SOLAR BATTERY BACKSHEET AND SOLAR BATTERY

RELATED APPLICATIONS

This is a §371 of International Application No. PCT/JP2010/059322, with an international filing date of Jun. 2, 2010 (WO 2010/140611 A1, published Dec. 9, 2010), which is based on Japanese Patent Application No. 2009-135832, filed Jun. 5, 2009, the subject matter of which is incorporated by reference.

TECHNICAL FIELD

This disclosure relates to a polyester film capable of being suitably used as a solar battery backsheet, and also relates to a solar battery and a solar battery that uses the film.

BACKGROUND

Polyester (particularly, polyethylene terephthalate, polyethylene-2,6-naphthalene dicarboxylate, etc.) resin is excellent in mechanical characteristic, thermal characteristic, chemical resistance, electric characteristic and formability, and is used for various uses. A polyester film obtained by making the polyester resin into a film shape, in particular, a biaxially oriented polyester film, because of its mechanical characteristic, electric characteristic, etc., is used as electrical insulation materials for a copper clad laminate, a solar battery backsheet, an adhesive tape, a printed circuit board, a membrane switch, a planar heat generator element, a flat cable, etc. as well as a magnetic recording material, a capacitor-purpose material, a wrapping material, a motor vehicle-purpose material, a building material, and various industrial materials for a photographic use, a graphical use, a thermosensitive transcription use, etc.

Among these uses, the uses as an electrical insulation material (e.g., a solar battery backsheet or the like), a motor vehicle-purpose material, a building material, etc., are often made in environments that are severe in temperature and moisture over long periods. However, since a general-purpose polyester resin reduces in molecular weight due to hydrolysis and also reduces in mechanical characteristic due to progress of embrittlement, betterment in that aspect, that is, improvement in moist heat resistance, is demanded.

To that end, various studies for restraining the hydrolysis of the polyester resin have been carried out. For example, a polyester resin (Japanese Patent Application Publication No. Sho 60-31526) that contains an alkali metal, an alkaline earth metal, and phosphorus and that contains internally deposited particles from catalyst residues, and a technology of improving the moist heat resistance of the polyester resin itself by adding an epoxy compound (Japanese Patent Application Publication Nos. Hei 9-227767 and 2007-302878) or a polycarbodiimide (Published Japanese Translation of PCT Application No. Hei 11-506487) have been studied. Besides, as for a biaxially oriented polyester film, studies have been done, such as a study for improving the moist heat resistance by providing the film with high IV (high intrinsic viscosity) and controlling the degree of plane orientation (Japanese Patent Application Publication No. 2007-70430).

On another hand, for application to the aforementioned uses, it is desired that multifunctionality of the material be realized by providing the material with characteristics besides the moist heat resistance (e.g., sliding characteristic, ultraviolet ray resistance, reflection characteristic, etc.). To that end, a polyester of two or more components, a mixture of polyester with another component for realizing more functions have been studied (e.g., Japanese Patent Application Publication Nos. 2003-155403, Hei 2-163155 and Hei 2-191638).

However, if polyester is mixed with another component (e.g., an ultraviolet absorbing agent, an inorganic particle, etc.) to realize multifunctionality of a polyester film and, in particular, a polyester film whose main component is an ethylene terephthalate unit, degradation of the material due to hydrolysis or the like progresses during kneading, giving rise to a problem of the resultant film having a reduced moist heat resistance while developing the function of the added component.

Accordingly, it could be helpful to provide a polyester film that is excellent in moist heat resistance and also capable of achieving another characteristic, particularly, ultraviolet ray resistance, light reflecting characteristic, etc.

SUMMARY

We thus provide:
(A) A polyester film containing particles and two kinds of crystalline polyester resins in which a sea-island structure is formed, the polyester film being characterized in that if a crystallization temperature of a crystalline polyester resin that forms a continuous phase (also referred to as matrix phase) (which is hereinafter referred to as crystalline polyester resin A) is represented by TccA and a crystallization temperature of a crystalline polyester resin that forms a dispersion phase (also referred to as domain phase) (which is hereinafter referred to as crystalline polyester resin B) is represented by TccB, an expression (1) below is satisfied, and that a degree of flatness of the dispersion phase is 3 or more, and that 70% or more of a total number of the particles are present in the dispersion phase or are in contact with the dispersion phase:

$$TccA - TccB \geq 5° C. \qquad \text{Expression (1).}$$

(B) The polyester film according the foregoing (A), wherein a polyester constituting the crystalline polyester resin B contains a cyclohexylene dimethylene terephthalate unit in an amount of 85 mol % relative to all of repetition units.

(C) The polyester film according to the foregoing (A) or (B), wherein the dispersion phase is present in a range that is greater than or equal to $0.1/\mu m$ and less than or equal to $5/\mu m$ in terms of an average number of dispersion phases per unit of 1 μm in a length in a film thickness direction.

(D) The polyester film according to any one of the foregoing (A) to (C), wherein the particles are contained in the polyester film in an amount of 0.5 to 30% by weight.

(E) The polyester film according to any one of the foregoing (A) to (D), whose elongation retention rate after the polyester film is treated for 48 hours in an atmosphere having a temperature of 125° C. and a relative humidity of 100% RH is greater than or equal to 30%, and whose elongation retention rate after the polyester film is irradiated for 48 hours with a metal halide lamp having an intensity of $100 mW/cm^2$ (wavelength range=295 to 450 nm, peak wavelength=365 nm) in an atmosphere having a temperature of 60° C., and 50% RH is greater than or equal to 20%.

(F) A laminate film in which the film according to any one of the foregoing (A) to (E) is layered on another film.

(G) The laminate film according to the foregoing (F), wherein the film according to any one of the foregoing (A) to (E) is layered as an outermost layer on at least one side.

(H) A polyester film containing particles and two kinds of crystalline polyester resins in which a sea-island structure is formed, the polyester film being characterized in that if a crystallization temperature of a crystalline polyester resin that forms a continuous phase (also referred to as matrix phase) (which is hereinafter referred to as crystalline polyester resin A) is represented by TccA and a crystallization temperature of a crystalline polyester resin that forms a dispersion phase (also referred to as domain phase) (which is hereinafter referred to as crystalline polyester resin B) is represented by TccB, an expression (1) below is satisfied, and that a degree of flatness of the dispersion phase is 3 or more, and that an elongation retention rate of the polyester film after the film is treated for 48 hours in an atmosphere having a temperature of 125° C. and a relative humidity of 100% RH is greater than or equal to 30%:

$TccA - TccB \geq 5° C.$   Expression (1).

(I) A manufacturing method for a polyester film comprising: the step in which, by using two kinds of crystalline polyester resins that have a sea-island structure formability (of which a crystalline polyester resin that forms a continuous phase (also referred to as matrix phase) is referred to as crystalline polyester A and a crystalline polyester resin that forms a dispersion phase (referred to as domain phase) is referred to as crystalline polyester resin B), particles are added to and dispersed in the crystalline polyester B; the step in which the crystalline polyester A is mixed into the crystalline polyester B in which the particles are dispersed and a mixture of the crystalline polyester A and the crystalline polyester B is extruded into a sheet shape; and the step in which the extruded sheet shape article is stretched:

$TccA - TccB \geq 5° C.$   Expression (1).

where TccA is a crystallization temperature of the crystalline polyester resin A, and TccB is a crystallization temperature of the crystalline polyester resin B.

(J) A solar battery backsheet in which the polyester film or the laminate film according to any one of the foregoing (A) to (H) is used.

(K) A solar battery in which the solar battery backsheet according to the foregoing (J) is used.

(L) The solar battery according to the foregoing (K) wherein a layer constructed of the film according to any one of the foregoing (A) to (E) is exposed facing an outside.

It is thus possible to provide a polyester film that is excellent in compatibility between the moist heat resistance that is high over a long period of time and other characteristics (in particular, the ultraviolet ray resistance, the light reflecting characteristic and the like). Furthermore, by using the foregoing polyester film, it is possible to provide a solar battery backsheet having high durability, and a solar battery that uses the solar battery backsheet.

BRIEF DESCRIPTION OF THE DRAWING

FIG. 1 is a schematic sectional view of a solar battery that uses our film.

DESCRIPTION OF REFERENCE CHARACTERS

1: solar battery backsheet
2: transparent filler agent
3: electricity generation element
4: transparent base plate

DETAILED DESCRIPTION

Among polyesters, there exist crystalline polyesters and amorphous polyesters. In a typical crystalline polyester, there exist a crystal portion and an amorphous portion. When such a crystalline polyester resin is stretched, a part of the amorphous portion comes to have a portion in which polyester is quasi-crystallized by orientation (hereinafter, referred to as "orientation-crystallized portion"), but the amorphous portion is not entirely quasi-crystallized. Herein, the amorphous portion is said to be in a state of having a lower density and a greater average intermolecular distance than the crystal portion and the orientation-crystallized portion. We discovered that (1) in the case where a polyester film is exposed to a moist hot atmosphere, moisture (water vapor) enters an interior thereof through spaces between molecules in the amorphous portion, which is low in density, and plasticizes the amorphous portion and heightens the mobility of molecules, (2) a proton of the carboxyl group terminal of polyester acts as a reaction catalyst, causing a hydrolysis in the amorphous portion in which the molecular mobility has been increased, and (3) the reduction in molecular weight due to the hydrolysis further increases the molecular mobility, and that as this process is repeated, the embrittlement of the film progresses and finally reaches a state in which even a small impact results in fracture. We next discovered that (i) the entrance of moisture into the interior of a polyester film is blocked to restrain hydrolysis by dispersing in a crystalline polyester resin A as a matrix a crystalline polyester resin B that is more apt to crystallize at relatively low temperatures than the crystalline polyester resin A, and (ii) as for particles added to provide a desired characteristic (e.g., particles having ultraviolet absorption power, or particles excellent in light reflecting characteristic), the hydrolytic reaction based on the adsorbed water that the particles originally have and on the catalytic action of particle surfaces can be restrained by dispersing the particles so that the particles exist in or contact the interior of the crystalline polyester resin B and therefore the surfaces of the particles are entirely or partially covered with the crystalline polyester resin B.

Hereinafter, our films, laminates, solar battery backsheets and solar batteries will be described in detail below with reference to concrete examples. In the polyester film, two kinds of crystalline polyester resin are used. The term "crystalline" herein concretely refers to a resin of which the crystal fusion heat quantity $\Delta Hm$ found from the peak area of a fusion peak in a differential scanning calorimetry chart of a 2nd run is greater than or equal to 1 J/g, the differential scanning calorimetry chart of the 2nd run being obtained, according to the method described in JIS K7122 (JIS Handbook 1999 edition was referred to), by heating a resin from 25° C. to 300° C. at a temperature increase rate of 20° C./minute (1st run), and maintaining the state for 5 minutes, and then quickly cooling the resin so that the temperature thereof becomes 25° C. or lower, and raising the temperature of the resin again from the room temperature to 300° C. at a temperature increase rate of 20° C./min. If a resin that does not have crystallinity is used, implementation of the stretching and the thermal treatment will not achieve sufficient formation of an orientation-crystallized portion, and will result in a resin that is poor in moist heat resistance. Besides, unfavorable results in terms of the film's heat resistance, dimensional stability and ultraviolet ray resistance are likely to occur.

It is preferable that the crystallinity of the two kinds of crystalline polyester resin be high, and it is desirable to use crystalline polyester resins whose crystal fusion heat quantity is greater than or equal to 5 J/g, and more preferably greater than or equal to 10 J/g, and even more preferably greater than or equal to 15 J/g, and, particularly preferably, 20 J/g. If resins that have crystallinity are used, it becomes possible to further heighten the orientational crystallization caused by the stretching and thermal processes, so that a polyester film that is more excellent in mechanical strength and dimensional stability can be made.

The two kinds of crystalline polyester resins have a sea-island structure when in a film. The term "sea-island structure formability" means that the two kinds of crystalline polyesters have a property in which the sea-island structure can be formed. As a resin that has sea-island structure formability, there can be mentioned a case where resins incompatible with each other are used. However, in our films, which use two kinds of crystalline polyester resins, a combination of resins incompatible with each other is rare. The sea-island structure can be easily and conveniently formed in a film in cases other than the aforementioned case where two kinds of incompatible polyesters are used, for example, by using two kinds of crystalline polyester resins between which the melting point difference and the fusion viscosity ratio are in specific ranges. Concretely, the sea-island structure can be easily and conveniently formed by using two kinds of polyester resins that satisfy the following expression (2) and the following expression (3):

$$TmB-TmA \geq 10° C. \qquad \text{Expression (2)}$$

where TmA is the melting point of a crystalline polyester resin that forms a continuous phase (also referred to as matrix phase) (which will be hereinafter referred to as crystalline polyester resin A), and TmB is the melting point of a crystalline polyester resin that forms a dispersed phase (also referred to as domain phase) (hereinafter, crystalline polyester resin B.

It is to be noted herein that the melting points TmA and TmB are each found as the temperature of a peak top of a fusion heat peak in a differential scanning calorimetry chart of a 2nd run of the resin which is obtained, according to the method described in JIS K7122 (JIS Handbook 1999 edition was referred to), by heating the resin from 25° C. to 300° C. at a temperature increase rate of 20° C./minute (1st run), and maintaining the state for 5 minutes, and then quickly cooling the resin so that the temperature thereof becomes 25° C. or lower, and raising the temperature of the resin from the room temperature to 300° C. at a temperature increase rate of 20° C./min. As for the difference TmB−TmA, it is desirable that the two crystalline polyester resins be selected so that the difference TmB−TmA is preferably greater than or equal to 15° C., and more preferably greater than or equal to 20° C. Although the difference TmB−TmA is not particularly limited, the difference TmB−TmA is preferred to be less than or equal to 55° C. in light of the temperature at the time of melt kneading and the filtration pressure:

$$\eta A/\eta B \leq 0.7 \qquad \text{Expression (3)}$$

where $\eta A$ is the melt viscosity of the crystalline polyester resin A, and $\eta B$ is the melt viscosity of the crystalline polyester resin B.

It is to be noted herein that melt viscosities $\eta A$ and $\eta B$ refer to the viscosities (poise) of the crystalline polyester resin A and the crystalline polyester resin B, respectively, which occur when the polyester resins, after being melted at a temperature 290° C. for 5 minutes, are extruded at a shearing rate of 200 sec-1 from a die of 1 mm in diameter and 10 mm in length. Besides, it is desirable that $\eta A/\eta B$ be preferably less than or equal to 0.6 and most preferably less than or equal to 0.4. Although the lower limit value of $\eta A/\eta B$ is not particularly limited, the lower limit value thereof is preferred to be greater than or equal to 0.05 in light of the temperature at the time of melt kneading and the filtration pressure.

The formation of the sea-island structure in the case of a combination of incompatible resins is considered to form by a mechanism as follows. That is, if the difference TmB−TmA is greater than or equal to 10° C. and the $\eta A/\eta B$ is less than or equal to 0.7, melt extrusion of the crystalline polyester resin B at a melt extrusion temperature in the vicinity of the melting point thereof causes a difference in the melt state (melt viscosity) between the crystalline polyester resin A and the crystalline polyester resin B. It is considered that when, to make a film, chips of the crystalline polyester resin A and the crystalline polyester resin B are mixed and shearing force is given at the time of extrusion via an extruder or the like, the shearing energy is consumed exclusively on the crystalline polyester resin A, and does not sufficiently propagate to the crystalline polyester resin B, so that the crystalline polyester resin B disperses due to flowage, but does not easily mix with the crystalline polyester resin A. Because TmB−TmA≥10° C. and $\eta A/\eta B \leq 0.7$, the sea-island structure can be formed without the crystalline polyester resin B completely mixing into the crystalline polyester resin A or becoming very small in the dispersion diameter during the melt kneading, and therefore the moist heat resistance of the resultant polyester film can be improved.

It is desirable that the melting point Tm of the crystalline polyester resin A and the crystalline polyester resin B satisfy the aforementioned expression (2), in light of the sea-island structure formability, and it is also desirable that the melting point Tm of each resin be greater than or equal to 245° C., in light of heat resistance and processability. If the melting point Tm is less than 245° C., inferiority may be found in the heat resistance of the film, and therefore such a melting point is not preferable. Besides, if the melting point Tm exceeds 320° C., the extrusion process becomes difficult in some cases, and therefore such a melting point is not preferable. If the melting points TmA and TmB in the polyester film is greater than or equal to 245° C. and less than or equal to 300° C., a polyester film that achieves both good heat resistance and good processability can be made.

When the crystallization temperature of the crystalline polyester resin A is represented by TccA and the crystallization temperature of the crystalline polyester resin B is represented by TccB, the crystalline polyester resin A and the crystalline polyester resin B need to satisfy the following expression (1):

$$TccA-TccB \geq 5° C. \qquad \text{Expression (1).}$$

It is preferable that TccA−TccB≥10° C., and is more preferable that TccA−TccB≥15° C. The difference in crystallization temperature being large in this manner means that the crystalline polyester resin B more easily crystallizes than the crystalline polyester resin A. Therefore, in the films in which dispersions of the crystalline polyester resin B that is high in crystallinity disperse in the film, the large crystallization temperature difference impedes entrance of moisture from the film surface into the interior of the film, and inhibits the hydrolysis so that the moist heat resistance of the polyester film can be improved. The progress of the hydrolysis can be restrained so that reduction in the degree of elongation is restrained even at the exposure to a moist hot atmosphere. Furthermore, degradation, including hydrolysis or the like caused by particles as described later, can be restrained so that the moist heat resistance of the polyester film can be improved. As long as the expression (1) is satisfied, the range of the TccB is not particularly limited. However, the range of the TccB is preferably less than or equal to 200° C., and more preferably less than or equal to 170° C., and still more preferably less than or equal to 150° C. Besides, the range of the TccA is not particularly limited, and can be appropriately selected and combined for use so that the aforementioned range is satisfied. The TccA and the TccB can be each found as a peak top temperature of a crystallization peak in a differential scanning calorimetry chart of the 2nd run that is obtained by heating the resin at a temperature increase rate of 20° C./min from 25° C. to 300° C. at a temperature increase rate of 20° C./minute (1st run), and maintaining the state for 5 minutes, and then quickly cooling the resin so that the temperature thereof becomes less than or equal to 25° C., and raising the temperature of the resin again from the room temperature to 300° C. at a temperature increase rate of 20° C./min, according to the method described in JIS K7122 (JIS Handbook 1999 edition was referred to). Depending on the compatibility between the resins, the melt viscosity thereof, or the manner of performing the kneading of the resins, it sometimes happens that portions of the crystalline polyester resin A and of the crystalline polyester resin B mix with each other in the process of melt extrusion. In that case, the difference between the TccA and the TccB in a stage of actual progress of crystallization sometimes becomes slightly smaller than the difference between the TccA and the TccB of raw-material resins occurring prior to the melt extrusion. If such a possibility is taken into account, it is preferable, from a viewpoint of improving the moist heat resistance, that the difference between the TccA of the crystalline polyester resin A and the TccB of the crystalline polyester resin B prior to the melt extrusion be greater than or equal to 10° C., and desirably greater than or equal to 15° C., and more desirably greater than or equal to 20° C.

The crystalline polyester resin A and the crystalline polyester resin B can be obtained by 1) polycondensation of a dicarboxylic acid component or an ester formability derivative thereof (hereinafter, collectively referred to as "dicarboxylic acid component") with a diol component, 2) polycondensation of a compound whose molecule has a carboxylic acid or a carboxylic acid derivative portion and a hydroxyl group, and a combination of 1) and 2). Besides, the polymerization of the crystalline polyester resin can be performed by a normal method.

In 1), as the dicarboxylic acid component, dicarboxylic acids such as: aliphatic dicarboxylic acids, including malonic acid, succinic acid, glutaric acid, adipic acid, suberic acid, sebacic acid, dodecane dionic acid, dimer acid, eicosan dionic acid, pimelic acid, azelaic acid, methylmalonic acid, ethylmalonic acid and the like; alicyclic dicarboxylic acids, including adamantane dicarboxylic acid, norbornene dicarboxylic acid, isosorbide, cyclohexanedicarboxylic acid, decalin dicarboxylic acid and the like; aromatic dicarboxylic acids, including terephthalic acid, isophthalic acid, phthalic acid, 1,4-naphthalene carboxylic acid, 1,5-naphthalene carboxylic acid, 2,6-naphthalene carboxylic acid, 1,8-naphthalene carboxylic acid, 4,4'-diphenyl dicarboxylic acid, 4,4'-diphenyl ether dicarboxylic acid, 5-sodium sulfoisophthalic acid, phenylendan dicarboxylic acid, anthracene dicarboxylic acid, phenanthrene dicarboxylic acid, 9,9'-bis(4-carboxy phenyl) fluorene acid and the like; or the ester derivatives of these dicarboxylic acids and the like can be mentioned as representative examples. However, the dicarboxylic acid component is not limited to these examples. Besides, these may be used alone, or may also be used in combination of a plurality of kinds according to need. Besides, the crystalline polyester resin A and the crystalline polyester resin B may also be a mixture of the polyester resins dissolved into each other.

Besides, a dicarboxylic acid compound obtained through condensation of an oxy acid, such as l-lactide, d-lactide, hydroxy benzoic acid and the like, any of derivatives of such oxy acids a train of plurality of such oxy acids and the like to a carboxy terminal of a dicarboxy component as mentioned above may also be used.

Besides, as the diol component, diols such as: aliphatic diols, including ethylene glycol, 1,2-propane diol, 1,3-propane diol, 1,4-butanediol, 1,2-butanediol, 1,3-butanediol and the like; alicyclic diols, including cyclohexane dimethanol, spiroglycol, isosorbide and the like; aromatic diols, including bisphenol A, 1,3-benzene dimethanol, 1,4-benzene dimethanol, 9,9'-bis(4-hydroxy phenyl)fluorene and the like can be mentioned as representative examples. However, the diol component is not limited to these examples. Besides, these may be used alone, or may also be used in a combination of a plurality of kinds according to need. Besides, a dihydroxy compound obtained through condensation of a diol to a hydroxy terminal of a diol component as mentioned above may also be used.

Besides, in 2), as examples of the compound whose molecule has a carboxylic acid or a carboxylic acid derivative skeleton and a hydroxyl group, there can be mentioned oxy acids, such as l-lactide, d-lactide, hydroxy benzoic acid and the like, derivatives thereof, oligomers of such oxy acids, products of condensation of an oxy acid to one of the carboxyl groups of a dicarboxylic acid and the like. The crystalline polyester resin A and the crystalline polyester resin B in the invention are not particularly limited as long as they are a combination of resins that satisfy the expression (1) and that have sea-island structure formability. As the combination, there can be mentioned, for example, combinations of the crystalline polyester resin A, such as polyethylene terephthalate (melting point=255° C., crystallization temperature=160° C.), polynaphthalene terephthalate (melting point=263° C., crystallization temperature=230° C.), polybutylene terephthalate (melting point=225° C., crystallization temperature=50° C.), or copolymers that contain a terephthalate as a main construction component, and the crystalline polyester resin B such as polycyclohexylene dimethylene terephthalate (melting point=290° C., crystallization temperature=130° C.), or copolymers that contain such a terephthalate as a main construction component or the like. More preferably, combinations of, as the crystalline polyester resin A, polyethylene terephthalate, polynaphthalene terephthalate, or a copolymer that contains such a terephthalate as a main construction component and, as the crystalline polyester resin B, poly cyclohexylene dimethylene terephthalate, or a combination that contains such a terephthalate as a main construction component can be suitably used, in light of making it possible to further heighten the mechanical strength and the moist heat resistance. Incidentally, the melt viscosity can be adjusted by the degree of polymerization, introduction of a cross-linking component or the like.

As for the crystalline polyester resin B in the polyester film, it is preferable that a cyclohexylene dimethylene terephthalate unit whose dicarboxylic acid component is terephthalic acid and whose diol component is cyclohexane dimethanol occupy 85 mol % or more of all the repetition units of the crystalline polyester resin B, and more preferably 90 mol % or more, and sill more preferably 95 mol %, and the upper limit value thereof is 100 mol %. If the cyclohexylene dimethylene terephthalate unit contained in the crystalline polyester resin B is less than 85 mol %, the dispersions of the crystalline polyester resin B becomes small at the time of the kneading with the crystalline polyester resin A, so that the blocking of the entrance of moisture into the film cannot be performed, or so that an ester exchange reaction comes to easily progress at an interface between the crystalline polyester resin A and the crystalline polyester resin B. Thus, the moist heat resistance of the polyester film may sometimes decline. A polyester film excellent in moist heat resistance can be made by causing the content of the cyclohexylene dimethylene terephthalate unit in the crystalline polyester resin B to be greater than or equal to 85 mol %. As for components other than the cyclohexylene dimethylene terephthalate unit, for example, as the dicarboxylic acid component, dicarboxylic acids such as: aliphatic dicarboxylic acids, including malonic acid, succinic acid, glutaric acid, adipic acid, suberic acid, sebacic acid, dodecane dionic acid, dimer acid, eicosan dionic acid, pimelic acid, azelaic acid, methylmalonic acid, ethylmalonic acid and the like; alicyclic dicarboxylic acids, including adamantane dicarboxylic acid, norbornene dicarboxylic acid, isosorbide, cyclohexanedicarboxylic acid, decalin dicarboxylic acid and the like; aromatic dicarboxylic acids, including isophthalic acid, phthalic acid, 1,4-naphthalene carboxylic acid, 1,5-naphthalene carboxylic acid, 2,6-naphthalene carboxylic acid, 1,8-naphthalene carboxylic acid, 4,4'-diphenyl dicarboxylic acid, 4,4'-diphenyl ether dicarboxylic acid, 5-sodium sulfoisophthalic acid, phenylendan dicarboxylic acid, anthracene dicarboxylic acid, phenanthrene dicarboxylic acid, 9,9'-bis(4-carboxy phenyl) fluorene acid and the like; or the ester derivatives of these dicarboxylic acids can be mentioned as representative examples, and as the diol component, for example, diols such as: aliphatic diols, including 1,2-propane diol, 1,3-propane diol, 1,4-butanediol, 1,2-butanediol, 1,3-butanediol and the like; alicyclic diols, including 1,4-cyclohexane dimethanol, spiroglycol, isosorbide, etc.; aromatic diols, including bisphenol A, 1,3-benzene dimethanol, 1,4-benzene dimethanol, 9,9'-bis(4-hydroxy phenyl)fluorene and the like can be mentioned as representative examples. However, the diol component is not limited to these examples. Besides, as another component, a cyclohexylene dimethylene isophthalate unit obtained through condensation polymerization of isophthalic acid as a dicarboxylic acid component and cyclohexane dimethanol as a diol component may be contained.

The crystalline polyester resin B forms a dispersion phase, and its degree of flatness needs to be greater than or equal to 3. If the degree of flatness of the dispersion phase is caused to be 3, high moist heat resistance and water resistance due to the dispersion phase of the crystalline polyester resin B will be effectively developed, so that the mechanical strength can be maintained for a long time.

The degree of flatness of the dispersion phase mentioned herein refers to the ratio a/d between the average thickness d of the dispersion phase in a film thickness direction and the long-axis length a of a main surface thereof, and can be found by the following procedures (1) to (7):

(1) Observation samples of a thin-film slice shape are produced by using a microtome, without squeezing the film section in the thickness direction. Incidentally, as for the samples, two kinds thereof are prepared, that is, MD-section thin film slices that are cut in a direction parallel to the lengthwise direction (MD) of the film, and TD-section thin film slices that are cut in a direction parallel to the widthwise direction (TD) thereof.

(2) Images of the obtained MD-section thin film slices in a magnified observation of 10000 times are obtained, by using a transmission electron microscope (TEM) (Trans-mission Electron Microscope "H-7100FA" by Hitachi Seisakujo (K.K.)). The location of observation is arbitrarily determined within the film. Besides, in the case where dispersion phases are hard to discern in the images, the film is stained beforehand by using osmium acid, ruthenium oxide and the like, as appropriate. The thickness direction of the film and the up-down direction of the images are to coincide with each other.

(3) With regard to the dispersion phase in the crystalline polyester resin B recognized in an image, the long-axis length and the thickness in the film thickness direction are found. Herein, the long-axis length is the length of the longest one of the line segments that can be drawn within the dispersion phase in a direction parallel to a film planar direction. Besides, the thickness in the film thickness direction is a distance from an end (upper end) of the dispersion phase to another end (lower end) thereof on a straight line that passes through a midpoint of the aforementioned line segment and that is orthogonal to the aforementioned line segment. A similar operation is performed with regard to at least 20 dispersion phases observed within such an image and, by using the average values thus obtained, the average long-axis length and the average thickness in the film thickness direction in the MD section are found.

(4) The sampling location in the film is arbitrarily changed, and an operation similar to the operation of (1) to (3) is performed 10 times in total. An average value of the average long-axis lengths obtained by the 10 operations is obtained as a final average long-axis length in the MD section. Similarly, an average value of the average thickness in the film thickness direction is obtained as a final average thickness in the film thickness direction in the MD section.

(5) With regard to the TD-section thin film slices, measurement similar to the measurement performed in the case of the MD-section thin film slices is performed to obtain a final long-axis length in the TD section and a final average thickness in the film thickness direction in the TD section.

(6) The greater value of the final long-axis length in the MD section and the final average thickness in the film thickness direction in the TD section is determined as a long-axis length (a) of the main surface, and an average thickness (d) is determined as the final average thickness in the film thickness direction in the same section.

(7) The value (a/d) obtained by dividing the long-axis length a obtained in (6) by the average thickness d in the film thickness direction obtained in (6) is determined as the degree of flatness in the dispersion phase.

The degree of flatness of the crystalline polyester resin B obtained by the above-described method is preferably 6 or greater, and more preferably 9 or greater.

As means for causing the degree of flatness to be 3 or greater, there can be mentioned, for example, methods in which a sheet shape resin material formed by dispersing the crystalline polyester resin B in the crystalline polyester resin A is 1') stretched monoaxially or biaxially so that the area stretch ratio becomes greater than or equal to 1.5, and 2') rolled in the thickness direction so that the rolling rate becomes greater than or equal to 90%, as well as 3') the methods 1') and 2') are both used, etc. The area stretch ratio is a ratio obtained by multiplying the stretch ratio in an axis direction by the stretch ratio in a direction orthogonal to the axis direction. Besides, in the method 2'), the rolling rate (%) is a rate obtained by dividing the post-rolling thickness by the pre-rolling thickness and multiplying the quotient by 100.

Besides, to heighten the degree of flatness of the crystalline polyester resin B, methods in which 1") the area stretch ratio or the rolling rate is increased, and 2") a crystalline polyester B is finely dispersed in the crystalline polyester A, and 3") the methods 1') and 2") are both used, etc., can be preferably used. The upper limit of the degree of flatness of the crystalline polyester resin B is not particularly limited. However, in light of the limit stretch ratio of the crystalline polyester resin A, the upper limit of the degree of flatness of the crystalline polyester resin B is substantially 100 or less, and more preferably 50 or less, and still more preferably 25 or less.

It is preferable that the dispersion phase be dispersed in a disc shape (including an elliptic disc), and that a main plane of a dispersion body be substantially parallel to the film plane. Due to this manner of process, it becomes possible to efficiently prevent moisture entering from the film surface and, even if the content of the crystalline polyester resin B is low, the moist heat resistance and the water resistance become excellent, and it becomes possible to maintain the mechanical strength over a long period of time.

Herein, the term "substantially parallel" means that the angle θ formed by the planar direction of the film and the main plane of the dispersion body is within 0±15°. More preferably, the angle θ is within 0±10°. Still more preferably, the angle θ is within 0±5°. Having the angle θ in this range makes it possible to develop high moist heat resistance.

The number of dispersion phases per unit length of 1 μm in the thickness direction of the film is preferred to be greater than or equal to 0.1/μm and less than or equal to 5/μm, and more preferably greater than or equal to 0.5/μm and less than or equal to 4/μm, and more preferably greater than or equal to 0.8/μm and less than or equal to 3/μm. In the case where the number of dispersion phases per unit length of 1 μm in the thickness direction is less than 0.1/μm, the effect of preventing moisture entering from the film surface becomes weak, and there is possibility of poor moist heat resistance. This is not preferable. In the case where the number exceeds 5/μm, it sometimes happens that the mechanical strength declines if the bending elastic modulus of the crystalline polyester resin B is high. This is not preferable.

The average thickness d of the dispersion phases in the film thickness direction is preferred to be greater than or equal to 1 nm and less than or equal to 5000 nm. The average thickness d is more preferably greater than or equal to 5 nm and less than or equal to 2500 nm, and still more preferably greater than or equal to 10 nm and less than or equal to 1000 nm. If the average thickness of the dispersion phase in the film thickness direction is less than 1 nm, the performance of preventing moisture entering from the film surface sometimes becomes insufficient. Therefore, the average thickness being less than 1 nm is not preferable. Besides, if the average thickness of the dispersion phase in the film thickness direction exceeds 5000 nm, a state in which the degree of flatness of the crystalline polyester resin B is small sometimes results, and irregularity of the water resistance performance becomes great. Therefore, the average thickness exceeding 5000 nm is not preferable. To have the average thickness d in the foregoing range, a resin formed in a sheet shape in which the crystalline polyester resin B is dispersed in the crystalline polyester resin A so that the dispersion radius is less than or equal to 5 μm, and more preferably 3 μm, and still more preferably 1 μm is stretched and compressed, whereby the average thickness as mentioned above can be obtained. The dispersion radius can be adjusted by the area stretch ratio or the rolling rate.

The polyester film contains particles. The particles are used to give the film a necessary function according to its purpose. As the particle that can be suitably used, a particle having an ultraviolet absorption power, a particle whose difference in refractive index from the crystalline polyester resin is large, a portion that has electroconductivity, a pigment are mentioned as examples. Such particles will better the weather resistance, the optical characteristic, the antistatic property, the color tone and the like. Incidentally, the particles refer to a particle whose average primary particle diameter is greater than or equal to 5 nm. Unless otherwise stated, the particle diameter means the primary particle diameter, and the particle means a primary particle.

The particles will be further described in detail. An inorganic particle and an organic particle can both be preferably used, and these particles can be used in combination. As the inorganic particle, there can be mentioned, for example: metals such as gold, silver, copper, platinum, palladium, and rhenium, vanadium, osmium, cobalt, iron, zinc, ruthenium, praseodymium, chromium, nickel, aluminum, tin, zinc, titanium, tantalum, zirconium, antimony, indium, yttrium, and lanthanum and the like; metal oxides such as zinc oxide, titanium oxide, cesium oxide, antimony oxide, tin oxide, indium tin oxide, yttrium oxide lanthanum oxide, zirconium dioxide, aluminum oxide, silicon oxide and the like; metal fluorides such as lithium fluoride, magnesium fluoride, aluminum fluoride, cryolite and the like; metal phosphates such as calcium phosphate, and the like; carbonate salts such as calcium carbonate, and the like; sulfate salts such as barium sulfate and the like; and talc, kaolin and the like. Besides, as the organic particle, there can be mentioned, for example: silicone-based compounds; cross-linked particles such as cross-linked styrene, cross-linked acryl, cross-linked melamine and the like; carbon-based compounds such as carbon, fullerene, carbon fiber, carbon nanotube and the like. Furthermore, the resin that is non-compatible with the crystalline polyester resin A and with the crystalline polyester resin B and that disperses in a fashion of islands in the two resins. Effects are remarkable particularly when an inorganic particle is used. Besides, considering that the film is often used outdoors, in the case where a particle having ultraviolet absorption power is used, for example, the case where an inorganic particle such as metal oxides, including titanium oxide, zinc oxide, cerium dioxide and the like, or an organic particle such as carbon base materials, including carbon, fullerene, carbon fiber, carbon nanotube and the like, is used, the utilization of the anti-ultraviolet ray by the particle will conspicuously deliver the effect of maintaining the mechanical strength over a long period of time.

The content of the particle contained in the polyester film is not particularly limited as long as the function by the particle is attained. However, it is preferable that the particle content be greater than or equal to 0.5% by weight and less than or equal to 30% by weight. The content of the particle is more preferably greater than or equal to 0.5% by weight and less than or equal to 28% by weight, and still more preferably greater than or equal to 0.5% by weight and less than or equal to 25% by weight. In the case where the content of the particle is less than 0.5% by weight, the effect thereof cannot be sufficiently delivered, and, in particular, in the case of a particle that has UV absorption power, the light resistance becomes insufficient, and the mechanical strength sometimes declines in a long time of use. Therefore, the particle content being less than 0.5% by weight it not preferable. In the case where the content of the particle is greater than 30% by weight, the mechanical strength of the film sometimes becomes weak. This is not preferable.

The average particle diameter of the particle is preferred to be greater than or equal to 0.005 μm and less than or equal to 5 μm, and more preferably greater than or equal to 0.01 μm and less than or equal to 3 µm, and particularly preferably greater than or equal to 0.015 µm and less than or equal to 2 µm.

It is necessary that 70% or more of the total number of particles be present in the dispersion phase or be in contact with the dispersion phase. It is preferable that 75% or more of or, more preferably, 80% or more of the total number of grains of the particle be present in or be in contact with the dispersion phase. The upper limit is not particularly limit, and our films include a mode in which 100% of the foregoing particle is present in the dispersion phase or is in contact therewith. Conformity to the foregoing range limitations will make it possible to achieve both the moist heat resistance and the characteristic that is improved by particles. Herein, whether a particle is contained in or is in contact with a dispersion phase can be checked by the following method. That is, (1) Observation samples in a thin-film slice shape are produced by using a microtome, without squeezing the film section in the thickness direction. Incidentally, as for the samples, two kinds thereof are prepared, that is, MD-section thin film slices that are cut in a direction parallel to the lengthwise direction (MD) of the film, and TD-section thin film slices that are cut in a direction parallel to the widthwise direction (TD) thereof.

(2) Images of the MD-section thin film slices obtained in a magnified observation of 50000 times, by using a transmission electron microscope (TEM) (Transmission Electron Microscope "H-7100FA" by Hitachi Seisakujo (K.K.)). The locations of observation are three or more locations arbitrarily determined within the polyester film (alternatively, a polyester layer (P layer) in the case where the polyester film is a laminate film). In the case where it is hard to discern dispersion bodies in the images, the film is stained beforehand by using osmium acid, ruthenium oxide and the like, as appropriate.

(3) The number of all the particles within an image obtained is counted, and is determined as a total number N. Of the total number, the number Nb of particles present in the dispersion phase or in contact with the dispersion phase is found. By using a value obtained therefrom, a proportion Nb/N is calculated. Such values thereof obtained at 3 or more observation locations are averaged.

In the case where less than 70% of the total number of the particles present in the film are neither present in any dispersion phase nor in contact therewith, a surface treatment agent added to particle surfaces to make better the activity of the particle surfaces or the kneading of the polyester becomes a cause of degradation of the polyester during the melt-kneading, or hydrolytic reactions that occur at the interfaces between the crystalline polyester resin A and the particles and the like cause embrittlement of a film surface or decline in the mechanical strength of the film. Such problems are more conspicuous the higher the activity of the particle surfaces of a film is. Because 70% or more of the total number of the particles are present in the dispersion phases or are in contact with the dispersion phases, surfaces of the particles are protected by the crystalline polyester resin B so that the embrittlement of surfaces or the degradation of the mechanical characteristic of the film at the time of the melt-kneading or in a moist-hot environment can be effectively prevented.

As a method of producing the polyester film, there can be mentioned, for example, preparation of the particles in advance as a raw material (chips) obtained by mixing the particles and the crystalline polyester resin B. Besides, as a method for causing 70% or more of the total number of the particles present in the film to be present in the dispersion phases or be in contact with the dispersion phases, there can be mentioned a method in which the TmA−TmB is caused to be 5° C. or higher as described above, or the crystalline polyester resin A and the crystalline polyester resin B are selected so that the ηA/ηB becomes less than or equal to 0.7, and the particles are used in the form of a raw material (chips) obtained by mixing the particles with the crystalline polyester resin B. A method of mixing the particles and the crystalline polyester resin B beforehand may be, for example, a method in which the particles are added during a polymerization step of the crystalline polyester resin B, a method in which the crystalline polyester resin B is dried according to need, and the dried resin and the particles are put in an extruder and are thereby heated to melt and kneaded, and then extrusion discharged from a mouthpiece is cut into small pellets, or a method in which in the film formation step of the film, the crystalline polyester resin B and the particles are melt-kneaded in an extruder separate from the one used for the crystalline polyester resin A, and then the kneaded material is caused to flow together with the crystalline polyester resin A. In the case where the crystalline polyester resin B and the particles are pelletized beforehand, the amount of the particles added to the crystalline polyester resin B is not particularly limited. However, in light of the extrusion characteristic at the time of melt-kneading and the handling characteristic of the pellets, it is preferable that the amount of the particles added be greater than or equal to 5% by weight and less than or equal to 70% by weight.

The polyester film is preferably biaxially oriented. By the biaxially orientation, orientation-crystallized portions can be effectively formed so that the moist heat resistance can be further heightened. The polyester film may be compounded with other additives (e.g., a heat resistant stabilizer agent, an ultraviolet absorbing agent, a weathering stabilizer agent, an organic slipping agent, a pigment, a dye, a filler agent, an antistatic agent, a nucleating agent and the like. However, the particles are not included in what is referred to as an "additive" herein) within a range such that desired effects will not be impaired. For example, in the case where an ultraviolet absorbing agent is selected as an additive, it becomes possible to heighten the light resistance of the polyester film, particularly by adding the ultraviolet absorbing agent into the crystalline polyester resin A. For example, as examples of an organic-based UV absorbing agent compatible with the polyester, there can be mentioned, for example, ultraviolet absorbing agents of a salicylic acid base, a benzophenone base, a benzo triazole base, a triazine base, a cyanoacrylate base and the like, ultraviolet absorbing agents of a hindered amine base and the like. Concretely, there can be mentioned, for example, salicylic acid-based p-t-butylphenyl salicylate, p-octyl phenyl salicylate, benzophenone-based 2,4-dihydroxy benzophenone, 2-hydroxy-4-methoxy benzophenone, 2-hydroxy-4-methoxy-5-sulfo benzophenone, 2,2',4,4'-tetrahydroxy benzophenone, bis(2-methoxy-4-hydroxy-5-benzoyl phenyl)methane, benzo triazole-based 2-(2'-hydroxy-5'-methyl phenyl)benzo triazole, 2-(2'-hydroxy-5'-methyl phenyl)benzo triazole, 2,2'-methylene bis[4-(1,1,3,3-tetramethylbutyl)-6-(2H benzo triazole-2-yl)phenol], triazine-based 2-(4,6-diphenyl-1,3,5-triazine-2-yl)-5[(hexyl)oxy]-phenol, and cyanoacrylate-based ethyl-2-cyano-3,3'-diphenyl acrylate), and also 2-(4,6-diphenyl-1,3,5-triazine-2-yl)-5-[(hexyl)oxy]-phenol, hindered amine-based bis(2,2,6,6-tetramethyl-4-piperidyl) sebacate, and succinic acid dimethyl.1-(2-hydroxy ethyl)-4-hydroxy-2,2,6,6-tetramethyl piperidine polycondensate, and are also nickel bis(octyl phenyl) sulfide, 2,4-di.t-butylphenyl-3',5'-di.t-butyl-4'-hydroxy benzoate and the like.

The content of the organic-based ultraviolet absorbing agent compatible with the polyester contained in the crystalline polyester resin A is preferred to be greater than or equal to 0.1% by weight and less than or equal to 10% by weight relative to the entire solid component of the crystalline polyester resin A, and more preferably greater than or equal to 0.25% by weight and less than or equal to 8% by weight, and still more preferably greater than or equal to 0.5% by weight and less than or equal to 5% by weight. In the case where the content of the organic-based UV absorbing agent compatible with the polyester is less than 0.5% by weight, the light resistance is insufficient, and the crystalline polyester resin A degrades in a long period of use, and thus the mechanical strength sometimes declines. This is not preferable. In the case where the content of the organic-based UV absorbing agent is greater than 10% by weight, the coloring of the crystalline polyester resin A sometimes great. This is not preferable.

It is preferable that the elongation retention rate after the polyester film is treated for 48 hours in an atmosphere having a temperature of 125° C. and a humidity of 100% RH be greater than or equal to 30%, and that the elongation retention rate after the film is subjected to an irradiation treatment for 48 hours with a metal halide lamp of 100 mW/cm$^2$ in intensity (wavelength range=295 to 450 nm, peak wavelength=365 nm) in an atmosphere having a temperature of 60° C. and a humidity of 50% RH be greater than or equal to 20%. As a preferable construction that satisfies the foregoing conditions, it is convenient to form the dispersion phases of the resin B by using the resin B and the resin A the TccA–TccB between which is greater than or equal to 5° C., and cause 70% or more of the particles having ultraviolet absorption power to be present in the dispersion phases of the resin B or be in contact therewith. In the case where the polyester film is to be irradiated with the metal halide lamp, particularly in a circumstance where the polyester film is layered on another film, an arrangement is made so that a surface formed by the film is exposed. The elongation retention rate mentioned herein is a rate measured on the basis of ASTM-D882 (ANNUAL BOOK OF ASTM STANDARDS 1999 edition was referred to), and is a value that is found by the following expression (4) where E0 is the fracture elongation of the film prior to the treatment, and E is the fracture elongation after the treatment:

Elongation retention rate (%)=$E/E0\times100$   Expression (4).

Herein, the elongation retention rate when the film has been treated for 48 hours in an atmosphere in which the temperature of the film is 125° C. and the humidity is 100% RH is preferred to be 35% or more, and more preferably 40% or more, and particularly preferably 50% or more. The setting of such a range makes the moist heat resistance of the film even better.

The elongation retention rate when the film has been subjected to the irradiation treatment for 48 hours by using a metal halide lamp (wavelength range=295 to 450 nm, peak wavelength=365 nm) having an intensity of 100 mW/cm$^2$ in an atmosphere having a temperature of 60° C., and 50% RH is preferred to be 25% more, and more preferably 30% or more, and particularly preferably 40% or more. The setting of such a range causes the ultraviolet ray resistance of the film to be good. Then, the film that achieves both of the aforementioned effects is excellent in the moist heat resistance and the ultraviolet ray resistance so that the mechanical strength can be maintained for a long period of time, for example, when the film is used as a solar battery backsheet.

The polyester film may be laminated with another film. As examples of the another film, there are a polyester layer for heightening the mechanical strength, an antistatic layer, an adherence layer for another material, an ultraviolet ray resistant layer for providing ultraviolet ray resistance, a flame retardant layer for giving a flame retardance, a hard coat layer for heightening the impact resistance, the abrasion resistance and the like, and arbitrary section therefrom is possible according to use. As concrete examples thereof, in the case where the polyester film is used as a film for a solar battery backsheet, there can be mentioned an easy adhesion layer for bettering the adherence to another sheet material, ethylene vinyl acetate in which electricity generation elements are buried, an ultraviolet ray resistant layer and a flame retardant layer as well as formation of an electroconductive layer that improves the voltage at which there occurs a partial discharge phenomenon that is an index of electric insulation property.

A mode in which the polyester film is laminated as an X layer together with another polyester layer (Y layer) is also a preferable construction. In that case, as for the Y layer, it is preferable that the content Wcy of the particles be greater than or equal to 0.1% by weight and less than or equal to 5% by weight relative to the Y layer and that the requirements for the polyester film be satisfied, in light of being able to heighten the moist heat resistance and the effect of the addition of effects and also the adherence while having an anti-curl characteristic. This is a construction of two divisions of functions in which the X layer is provided with a layer that is given a greater effect of addition of the particles, and the other layer, that is, the Y layer, is provided with a layer in which importance is placed on the moist heat resistance and the adherence. More preferably, the content Wcy of the particles in the Y layer is greater than or equal to 1% by weight and less than or equal to 3% by weight relative to the Y layer.

As a method of laminating the film with another film, for example, in the case where the materials of the individual layers to be laminated include a thermoplastic resin as a main component material, there can be used a method (co-extrusion method) in which two different materials are separately put into two extruders, and are melted and are co-extruded from the mouthpieces onto a cast drum and are processed into a sheet shape, a method (melt laminate method) in which a coating layer material is put into an extruder, and is melt-extruded, and is extruded from the mouthpiece onto and is laminated with a sheet that has been produced of a single film, a method (heat laminate method) in which films are separately produced, and are thermally compression-bonded by a group of heated rolls or the like, and a method (adhesion method) in which films are attached to each other via an adhesive as well as a method (coating method) in which materials dissolved in solvents are applied and dried, a method combining two more of these methods and the like.

The thickness of the film is preferred to be greater than or equal to 1 μm and less than or equal to 200 μm, and more preferably greater than or equal to 3 μm and less than or equal to 150 μm, and more preferably greater than or equal to 5 μm and less than or equal to 100 μm. In the case where the thickness of the polyester film is less than 1 μm, the moist heat resistance, the handling characteristic and the planarity of the film may become bad, and particularly in the case where particles having ultraviolet absorption power are contained, there is also a possibility of the excessively small film thickness causing poor ultraviolet ray resistance. This is not preferable. In the case where the thickness exceeds 200 μm, particularly in a circumstance where film is used as a solar battery backsheet, the entire thickness of the solar battery cell becomes excessively thick. This is not preferable. In the case of a laminate film obtained by laminating the polyester film and another film, the total thickness thereof is preferred to be greater than or equal to 10 μm and less than or equal to 300 μm, and more preferably greater than or equal to 20 μm and less than or equal to 200 μm, and most preferably greater than or equal to 30 μm and less than or equal to 150 μm. In the case where the thickness of the laminate is less than 10 μm, the flatness of the film becomes bad, and in the case where the thickness thereof is greater than 300 μm, for example, in a circumstance where the film is used as a solar battery backsheet, the entire thickness of the solar battery cell becomes excessively thick. These are not preferable.

The proportion of the thickness of the film to the total thickness of the laminate is greater than or equal to 1% and less than or equal to 50%, and more preferably greater than or equal to 2% and less than or equal to 40%, and most preferably greater than or equal to 5% and less than or equal to 30%. In the case where this proportion is less than 1%, there is possibility of the moist heat resistance becoming poor, and particularly in a circumstance where particles having ultraviolet absorption power are used, there is possibility of the ultraviolet ray resistance becoming poor. This is not preferable. In the case where the proportion exceeds 30%, particularly in a circumstance where the film is provided as a two-layer film and is formed by co-extrusion/co-stretching, the film is apt to curl due to the differences between the layers in terms of the mechanical characteristic (e.g., the manner of orientation, the stretched state, thermal contraction and the like).

Next, a manufacturing method for the polyester film will be described with reference to examples. As a method for obtaining the crystalline polyester resin A and the crystalline polyester resin B, a polymerization method by a normal process can be adopted. For example, the resins can be obtained by causing an ester exchange reaction between a dicarboxylic acid component such as terephthalic acid or the like or a derivative thereof, and a diol component such as ethylene glycol or the like, by a well-known method. As a method in which an aliphatic diol component, an aromatic diol component, an alicyclic dicarboxylic acid component, an isophthalic acid component and naphthalene dicarboxylic acid component are contained as copolymerization components, the resins can be obtained by adding, at the time of polymerization, an alicyclic diol component and an aromatic diol component as diol components, and an alicyclic dicarboxylic acid component, an isophthalic acid component and a naphthalene dicarboxylic acid component (or ester derivatives thereof) as dicarboxylic acid components and causing polymerization. Furthermore, as for the crystalline polyester resin B, there are, for example, a method in which "Copolyester 13319" by Eastman Chemical (a polyester resin in which 95% of the total dicarboxylic acid component is terephthalic acid, and 5 mol % thereof is isophthalic acid, and 100% of the total diol component is 1,4-cyclohexane dimethanol) is used, and a method in which dicarboxylic acid components (or derivatives thereof), such as terephthalic acid, isophthalic acid, naphthalene dicarboxylic acid and the like, and 1,4-cyclohexane dimethanol are added, and copolymerized by an ester exchange reaction by a well-known method.

For polymerization, a reaction catalyst (polymerization catalyst) that has been known (an alkali metal compound, a zinc compound, a lead compound, a manganese compound, a cobalt compound, an aluminum compound, an antimony compound, a titanium compound or the like) may also be used. Furthermore, as a color tone adjusting agent, a phosphorus compound or the like may be added. More preferably, at an arbitrary stage before the manufacturing method for the polyester is completed, it is preferable to add an antimony compound or a germanium compound or a titanium compound as a polymerization catalyst. As such a method, for example, if a germanium compound is taken for an example, it is preferable to add a germanium compound powder as it is.

The particles are preferred to be prepared beforehand as a raw material obtained by melt-kneading the particles with the crystalline polyester resin B.

Next, a method for making raw materials into a film will be discussed. First, there can be mentioned a method of producing a single-layer sheet by melt-extruding a polyester resin raw material, which has been dried according to need, by an extruder, and by ejecting it from a die, and a method (co-extrusion method) in which by using two or more extruders, and a multi-manifold die, a feed block, a static mixer, a pinole and the like, the polyester film and a thermoplastic resin film are layered, and are co-extruded from dies, and thereby a laminate film that includes a layer in which the polyester film is layered is obtained. It is appropriate that the extrusion temperature be a temperature in the vicinity of the melting point of the crystalline polyester resin B so that there occurs a difference in the melt viscosity between the crystalline polyester resin A and the crystalline polyester resin B to be kneaded together.

The sheet ejected from the die by the foregoing method is extruded on a cooling body such as a casting drum or the like, and is therefore cooled and solidified, and thus a cast sheet is obtained. At this time, it is preferable that the sheet be closely attached to the cooling body such as a casting drum or the like, by electrostatic force, by using an electrode of a wire shape, a tape shape, a needle shape, a knife shape or the like, and be rapidly solidified.

The cast sheet obtained in this manner is preferred to be biaxially stretched. The biaxial stretching refers to stretching in a longitudinal direction (lengthwise direction) and a lateral direction (width direction). As for the stretching method, the longitudinal stretching and the lateral stretching may be consecutively performed as biaxial stretching, or may also be simultaneously performed. A biaxially stretched film may be further stretched again in the longitudinal and/or lateral direction. Herein, the stretching in the longitudinal direction refers to stretching for giving the film a molecular orientation in the lengthwise direction and, usually, is accomplished by a difference between the circumferential speeds of rolls. This stretching may be performed in one stage, or may also be stretched in many stages through the use of a plurality of roll pairs. Although the rate of the stretching differs depending on the kind of resin, a rate of 2 to 15 times in each of the lengthwise direction and the width direction is usually preferable.

To complete the crystalline orientation of the obtained biaxially stretched film and give it a planarity and a dimensional stability, it is preferable to perform a heat treatment at a temperature less than the melting point TmA of the crystalline polyester resin A for a duration of greater than or equal to 1 second and less than or equal to 30 seconds, and slowly uniformly cool the film, and then cool it to a room temperature. Generally, if the heat treatment temperature is low, the heat contraction of the film becomes large. Therefore, to give a high thermal dimensional stability, the heat treatment temperature is preferred to be set high. However, if the heat treatment temperature is set excessively high, the amorphous portions loosen to a state in which molecular mobility is high, so that, sometimes, hydrolysis becomes likely to occur, and in a moist hot atmosphere, the thermal crystallization following the hydrolysis is accelerated, and the embrittlement becomes likely to occur. This is not preferable. Therefore, the heat treatment temperature is preferred to be set so that a value obtained by subtracting the heat treatment temperature from the melting point TmA of the crystalline polyester resin A is greater than or equal to 40° C. and less than or equal to 90° C., and more preferably greater than or equal to 50° C. and less than or equal to 80° C., and still more preferably greater than or equal to 55° C. and less than or equal to 75° C.

Besides, in the heat treatment step, a loosening treatment of 3 to 12% in the width direction or the lengthwise direction may be performed according to need. Subsequently, according to need, a corona discharge treatment may be performed to further heighten the adherence to another material, and then rolling-up is performed, whereby the polyester film can be obtained.

As for the laminate film, it is possible to use, in addition to the foregoing co-extrusion method, a method (melt laminate method) in which, on to a produced film, another thermoplastic resin is melt-extruded, and the extrusion is laminated while being extruded from the mouthpiece, a method (thermal laminate method) in which the film and a film made of another resin are thermocompression-bonded together, a method (adhesion method) in which the film and a film made of another resin are bonded together via an adhesive, a method (coating method) in which another material is applied to and laminated on a surface of the polyester film, methods combining any two or more of the methods, etc.

Since the polyester film has moist heat resistance, and is able to achieve both the moist heat resistance and other characteristics such as ultraviolet ray resistance, light reflecting characteristic and the like, the polyester film can be used in situations in which importance is placed on long-period durability, and particularly can be suitably used as a film for a solar battery backsheet.

To make the film into a solar battery backsheet, for example, a construction is made of the polyester film, and an EVA adherence layer that improves the adherence to an ethylene-vinyl acetate copolymer (hereinafter, sometimes abbreviated as "EVA"), an anchor layer for raising the adherence to the EVA adherence layer, a water vapor barrier layer, an ultraviolet absorption layer for absorbing ultraviolet rays, a light reflection layer for heightening the electricity generation efficiency, a light absorption layer for developing design characteristic, an adhesion layer for adhering layers and the like. In particular, the polyester film is suitably used as the ultraviolet absorption layer, the light reflection layer and the light absorption layer.

It is appropriate that the film for use as the ultraviolet absorption layer in a solar battery backsheet have a function of blocking light rays of 380 nm or less. The film for use as the light reflection layer is able to prevent degradation of the resins of layers provided on an inner side of the light reflection layer by reflecting ultraviolet rays, and is able to heighten the electricity generation efficiency by reflecting light that reaches the backsheet without being absorbed by solar battery cells, and thereby returning it to the cell side. The film for use as the light absorption layer is able to prevent degradation of the resins of layers provided on the inner side of the light absorption layer by absorbing ultraviolet rays, and is also able to improve the design characteristic of the solar battery.

The EVA adherence layer is a layer that improves the adherence to the EVA-based resin that seals in electricity generation elements, and is installed at a side that is the nearest to the electricity generation elements, and contributes to the adhesion between the backsheet and the system. The material thereof is not particularly limited as long as the adherence to the resin of EVA base is developed. For example, EVA, and also mixtures of EVA with ethylene-methyl acrylate copolymer (EMA), ethylene-ethyl acrylate copolymer (EEA), ethylene-butyl acrylate copolymer (EBA), ethylene-methacrylic acid copolymer (EMAA), ionomer resin, polyester resin, urethane resin, acrylic resin, polyethylene resin, polypropylene resin, polyamide resin and the like, can be preferably used. To improve the adherence of the EVA adherence layer to the backsheet according to need, formation of the anchor layer is also preferably performed. The material thereof is not particularly limited as long as the adherence to the EVA adherence layer is developed. For example, a mixture whose main construction components are resins such as acrylic resin, polyester resin and the like, can be preferably used.

The water vapor barrier layer is a layer for preventing the entrance of water vapor from the backsheet side to prevent degradation of electricity generation elements by water vapor when a solar battery is constructed. The layer is formed by providing on a film surface a metallic layer of aluminum or the like or an oxide such as silicon dioxide, aluminum oxide and the like, by a well-known method such as vacuum vapor deposition, sputtering and the like. The thickness thereof is usually preferred to be in the range greater than or equal to 100 angstroms and less than or equal to 200 angstroms. In this case, both the case where a gas barrier layer is provided directly on the polyester film and the case where a gas barrier layer is provided on a film other than our film and this film is layered on our film surface can be preferably employed. Besides, a method in which a metal foil (e.g., an aluminum foil) is layered on a film surface can also be employed. In this case, the thickness of the metal foil is preferred to be in the range greater than or equal to 10 μm and less than or equal to 50 μm, from the viewpoint of the processing characteristic and the gas barrier characteristic.

By combining the foregoing layers and our polyester film, a solar battery backsheet is formed. In the solar battery backsheet, it is not necessary that the foregoing layers be all formed as independent layers, but it is also a preferable formation to form an integrated-function layer that is equipped with a plurality of functions. In the case where the polyester film already has necessary functions, it is also possible to omit other layers for providing those functions. For example, in the case where the polyester film has a light reflecting characteristic in a construction that includes a layer that contains a white pigment or gas bubbles, the light reflection layer can sometimes be omitted, and in the case where the polyester film has a light absorbing characteristic in a construction that includes a layer that contains a light absorption agent, the absorption layer can sometimes be omitted, and in the case where the polyester film has a construction that includes a layer that contains an ultraviolet absorbing agent, the ultraviolet absorption layer can sometimes be omitted.

In the foregoing mode, it is preferable that at least one of the outermost layers of the solar battery backsheet be our polyester film. Besides, in the case where the polyester film is a laminate film, it is preferable that a layer made up of our polyester film be at least one of the outermost layers of the solar battery backsheet. Furthermore, it is appropriate that only one of the outermost layers be our polyester film or a layer made up of our polyester film. By making such a construction, it is possible to make a backsheet in which the effect of the addition of particles is more developed.

Since the polyester film is excellent in the moist heat resistance in comparison with the related-art polyester film, the solar battery backsheet that includes the film can be made to have high moist heat resistance and high ultraviolet ray resistance in comparison with the related-art backsheet. Herein, as for the solar battery backsheet, to cause the backsheet to deliver the effect of high moist heat resistance and high ultraviolet ray resistance of the polyester film, it is preferable that the volume proportion of the film to the entire backsheet be greater than or equal to 5%. The volume proportion is more preferably greater than or equal to 10%, and still more preferably greater than or equal to 15%, and particularly preferably greater than or equal to 20%.

As for the solar battery backsheet that employs the polyester film, it is preferable that the elongation retention rate after the sheet is left for 48 hours in an atmosphere having a temperature of 125° C. and a humidity of 100% RH be greater than or equal to 30% and that the elongation retention rate after the film is irradiated with a metal halide lamp having an intensity of 100 mW/cm$^2$ (a wavelength of 295 to 450 nm, and a peak wavelength of 365 nm) for 48 hours in an atmosphere having a temperature of 60° C. and a humidity of 50% RH be greater than or equal to 20%. In the case where the solar battery backsheet that employs the polyester film is irradiated with ultraviolet rays, particularly in the case where the polyester film is a laminate film, the side of the polyester film serves as a surface that is irradiated with ultraviolet rays. The elongation retention rate mentioned herein is a rate measured on the basis of ASTM-D882 (ANNUAL BOOK OF ASTM STANDARDS 1999 edition was referred to), and is a value obtained by the following expression (5), where E0' is the fracture elongation of the solar battery backsheet prior to the process, and E1' represents the fracture elongation after the backsheet is left for 48 hours in an atmosphere having a temperature of 125° C. and a humidity of 100% RH, and E2' represents the fracture elongation after the backsheet is irradiated with ultraviolet rays having an intensity of 100 mW/cm$^2$ in an atmosphere having a temperature of 60° C. and a humidity of 50% RH:

Elongation retention rate (%)=$E1'$ (or $E2'$)/$E0'$×100    Expression (5).

E1' is a value that is measured after a specimen is cut out into a shape of a measurement piece and then is left for 48 hours in an atmosphere having a temperature 125° C. and a humidity of 100% RH. More preferably, the elongation retention rate by the foregoing expression is greater than or equal to 30%, more preferably greater than or equal to 35%, particularly preferably greater than or equal to 40%, and most preferably greater than or equal to 50%. With regard to the polyester film, if the elongation retention rate after the film is left for 48 hours in the atmosphere having a temperature of 125° C. and a humidity of 100% RH is less than 30%, the degradation by moist heat progresses, for example, when a solar battery equipped with the backsheet is used for a long period of time so that when an impact from outside acts on the solar battery (e.g., in the case where a falling stone hits the solar battery, or the like), the backsheet sometimes fractures. Therefore, the aforementioned elongation retention rate being less than 30% is not preferable.

E2' is a value that is measured after a specimen is cut out into a shape of a measurement piece and then is irradiated with ultraviolet rays having an intensity of 100 mW/cm$^2$ for 48 hours in an atmosphere having a temperature of 60° C. and a humidity of 50% RH. More preferably, the elongation retention rate by the foregoing expression is greater than or equal to 20%, more preferably greater than or equal to 25%, particularly preferably greater than or equal to 30%, and most preferably greater than or equal to 40%. With regard to the polyester film, if the elongation retention rate after the film is irradiated with a metal halide lamp having an intensity of 100 mW/cm$^2$ (wavelength range=295 to 450 nm, peak wavelength=365 nm) in the atmosphere having a temperature of 60° C. and a humidity of 50% RH is less than 30%, degradation by ultraviolet rays progresses, for example, when a solar battery equipped with the backsheet is used for a long period of time so that when an impact from outside acts on the solar battery (e.g., in the case where a falling stone hits the solar battery, or the like), the backsheet sometimes fractures. Therefore, the aforementioned elongation retention rate being less than 30% is not preferable. With regard to the polyester film, if the elongation retention rate after the film is left for 48 hours in the atmosphere having a temperature of 125° C. and a humidity of 100% RH is greater than or equal to 30% and the elongation retention rate after the film is irradiated with a metal halide lamp having an intensity of 100 mW/cm$^2$ (a wavelength range of 295 nm to 450 nm, and a peak wavelength of 365 nm) in the atmosphere having a temperature of 60° C. and a humidity of 50% RH is greater than or equal to 20%, the moist heat resistance and the ultraviolet ray resistance can both be achieved, and the mechanical strength of the solar battery backsheet can be maintained over a long period, and a highly durable solar battery can be made. Therefore, the aforementioned condition is preferable.

The thickness of the solar battery backsheet is preferred to be greater than or equal to 50 μm and less than or equal to 500 μm, and more preferably greater than or equal to 100 μm and less than or equal to 300 μm. Still more preferably, the thickness thereof is greater than or equal to 125 μm and less than or equal to 200 μm. In the case where the thickness is less than 10 μm, it becomes difficult to secure flatness of the film. On the other hand, in the case where the thickness is greater than 500 μm, the entire thickness of a solar battery, in the case where the film is amounted in the solar battery, sometimes becomes excessively great.

The solar battery is characterized by using a solar battery backsheet that employs the polyester film. The solar battery backsheet that employs the polyester film, exploiting the characteristic of being more excellent in the moist heat resistance and other functions and, in particular, the ultraviolet ray resistance, than the related-art backsheet, makes it possible to heighten the durability of a solar battery and to reduce the thickness of the solar battery in comparison with the related-art solar battery. An example of such a construction is shown in FIG. 1. A construction is made by bonding a transparent base plate 4 of glass or the like and a resin sheet called solar battery backsheet 1 to a body in which electricity generation elements to which lead wires (not shown in FIG. 1) that extract electricity are sealed in by a transparent filler agent 2 that is transparent, such as an EVA-based resin or the like. However, that solar battery is not limited to this construction, but may employ an arbitrary construction.

Electricity generation elements 3 convert light energy of sunlight into electric energy, and a plurality of arbitrary elements of a crystal silicon base, a polycrystal silicon base, a microcrystal silicon base, an amorphous silicon base, a copper indium selenide base, a compound semiconductor base, a dye sensitization base and the like can be connected in series or parallel for use.

Because the transparent base plate 4 having translucency is positioned at a most superficial layer of the solar battery, a transparent material having high weather resistance, high stain resistance and high mechanic strength characteristic besides high transmittance is used therefore. The transparent base plate 4 having translucency may employ any material if the foregoing characteristics are fulfilled. As examples the material, glass, there can be preferably mentioned fluorine-based resins, including tetrafluoroethylene-ethylene copolymer (ETFE), polyvinyl fluoride resin (PVF), polyvinylidene fluoride resin (PVDF), polytatrafluoroethylene resin (TFE), tetrafluoroethylene-hexafluoropropylene copolymer (FEP), polychlorotrifluoroethylene resin (CTFE), polyvinylidene fluoride resin and the like, olefin-based resin, acryl-based resin, mixtures thereof and the like. In the case of glass, it is more preferable to use a reinforced glass. In the case where a resin-made translucent substrate is used, a material obtained by stretching the foregoing resin monoaxially or biaxially is also preferably used from the viewpoint of mechanical strength.

For these substrates, performance of a corona treatment, a plasma treatment, an ozone treatment or an easy-adhesion treatment is preferably carried out to give adhesion property between the substrates and the EVA-based resin, which is a sealer agent for the electricity generation elements.

As for the transparent filler agent 2 for sealing in the electricity generation elements, a material having high transparency, high weather resistance, high adhesion property and high heat resistance is used, for the purpose of coating irregularities of the surfaces of the electricity generation elements and fixing the elements, and protecting the electricity generation elements from external environments, and for the purpose of electrical insulation, and also for adhesion to the electricity generation elements and a substrate having translucency and the backsheet. As examples thereof, ethylene-vinyl acetate copolymer (EVA), ethylene-methyl acrylate copolymer (EMA), ethylene-ethyl acrylate copolymer (EEA) resin, ethylene-methacrylic acid copolymer (EMAA), ionomer resin, polyvinyl butyral resin and mixtures of these can be preferably used. Of these resins, ethylene-vinyl acetate can be more preferably used, in light of being excellent in the balance of weather resistance, adhesion property, filling property, heat resistance, low-temperature resistance and impact resistance.

In the solar battery equipped with our backsheet, it is preferable that the polyester film or a layer that is constructed the polyester film be exposed, facing outside. By making this construction, it is possible to make a solar battery in which the moist heat resistance and the effect of the addition of particles added are more developed.

As stated above, by incorporating into a solar battery system the solar battery backsheet that employs our polyester film, it becomes possible to make a highly durable and/or thin-type solar battery system in comparison with the related-art solar battery. The solar battery can be suitably used in various uses without being limited to outdoor uses or indoor uses such as in photovoltaic power generation systems, electric power sources for small-size electronic component parts and the like.

Evaluation Methods for Characteristics (1) Melting Point TmA, Melting Point TmB, Crystallization Temperature TccA, and Crystallization Temperature TccB According to the method described in JIS K7122 (JIS Handbook 1999 edition was referred to), the melting point TmA and the crystallization temperature TccA of the crystalline polyester resin A and the melting point TmB and the crystallization temperature TccB of the crystalline polyester resin B were measured by using "Robot DSC-RDC220", which is a differential scanning calorimetry apparatus by Seiko Denshi Kohgyoh (K.K.), and Disk Session "SSC/5200" for data analysis. As for the measurement, 5 mg of a crystalline polyester resin was weighed on a sample pan, and the resin was heated from 25° C. to 300° C. at a temperature increase rate of 20° C./min in the 1st run, and the resin was kept in that state for 5 minutes, and then was rapidly cooled to 25° C., and was heated again from the room temperature to 300° C. at a temperature increase rate of 20° C./min. The temperature of a peak top in the crystal melting peak of the 2nd run obtained was defined as a melting point Tm, and the temperature of a peak top in crystallization enthalpy was defined as a crystallization temperature Tcc.

(2) Melt Viscosity ηA, and Melt Viscosity ηB

By using a resin having been dried at 90° C. in an oven for 4 hours or more or having been dried in a vacuum drier at a temperature equal to the melting point-120° C. or more 50° C. or less for 4 hours or more, the melt viscosities were measured by using Shimadzu Flow Test CFT-500-type A by Shimadzu Seisakusho (K.K.). The resin amount was set at about 5 g, and the melt temperature was set at 290° C., and the load was set at 10, 15 and 20 N (loading was started after 5 minutes following the start of sample setting), and the shear rates and the melt viscosities at each of the loads were found. The die used was a die of $\phi$1 mm and L=10 mm. The number of times of performing measurement for each load was three, and numerical value data about the melt viscosities and the shear rates for the individual loads which are obtained by finding average values of the measurements were graphed, and from the graph, a value of shear rate of 200 $sec^{-1}$ was found.

(3) Degree of Flatness of Dispersion Phases

By using a microtome, observation samples of a thin-film slice shape were produced without squeezing the film sectional surfaces in the thickness direction. As for the samples, two kinds thereof were prepared, that is, MD-section thin film slices cut in a direction parallel to the lengthwise direction (MD) of the film, and TD-section thin film slices cut in a direction parallel to the widthwise direction (TD) thereof.

Next, the obtained MD-section thin film slices were observed at a magnification of 10000 times, and images thereof were obtained, by using a transmission electron microscope (TEM) (Transmission Electron Microscope "H-7100FA" by Hitachi Seisakujo (K.K.)). Besides, in the case where dispersion bodies were hard to discern in the images, the film was stained beforehand by using osmium acid, ruthenium oxide or the like, as appropriate. By using the obtained images, the degree of flatness of the polyester resin B was found according to the above-described method.

(4) Number of Dispersion Phases Per Unit of 1 μm in Length in Thickness Direction of Film The number of dispersion phases made up of the crystalline polyester B per unit of 1 μm in the film thickness was found by using the images obtained as in the foregoing section (3). Incidentally, the number of dispersion phases was found at each of five locations in the film that were arbitrarily defined, and an average value of the numbers was determined as the number of dispersion phases per unit of 1 μm in the length in the thickness direction of the film.

(5) Distribution of Particles

The number of all the particles in an image observed at a magnification of 50000 times which was obtained by substantially the same technique as in the section (3) was counted, and the counted number was defined as a total number N. Of that number, the number Nb of particles that are present in or are in contact with dispersion phases of the crystalline polyester resin B was found. By using the obtained values, a proportion Nb/N of the number of the particles that are present in the film and that are present in or are in contact with dispersion phases made up of the crystalline polyester B to the total number with regard to the particles present in the film was calculated. The proportion was found at each of five locations within the polyester layer which were arbitrarily defined, and an average value of these found values was determined as a proportion of the particles.

(6) Fracture Elongation Measurement

On the basis of ASTM-D882 (ANNUAL BOOK OF ASTM STANDARDS 1999 was referred to), samples were cut out into a size of 1 cm×20 cm, and fracture elongations of the samples at the time of being pulled in a chuck interval of 5 cm at a pulling speed of 300 mm/min were measured. The number of samples was n=5, and the measurement was performed in both the longitudinal direction and the lateral direction of the film, and the fracture elongations were found as average values thereof (7) Elongation Retention Rate after Moist Heat Resistance Test After specimens was cut into a shape of measurement pieces (1 cm×20 cm), the measurement pieces were treated by a Pressure Cooker made by Tabai Espec (K.K.) for 48 hours in a condition of a temperature of 125° C. and a relative humidity of 100% RH. After that, the fracture elongation was measured according to the foregoing section (6). The measurement was performed with n=5, and was performed in both the longitudinal direction and the lateral direction of the film, and an average value thereof was determined as a fracture elongation E1. With regard to the film prior to the treatment, too, a fracture elongation E0 was measured according to the section (6), and, by using the fracture elongations E0 and E1, the elongation retention rate was calculated by the following expression:

Elongation retention rate (%)=$E1/E0 \times 100$.

As for the fracture elongation of the backsheet, the fracture elongation of the backsheet prior to the treatment was represented by E0', and a fracture elongation E1' after the treatment of 48 hours in a condition of a temperature 125° C. and a relative humidity of 100% RH was found, and the elongation retention rate was calculated by the following expression:

Elongation retention rate (%)=$E1'/E0' \times 100$.

The obtained elongation retention rate was judged as follows:
In the case where the elongation retention rate was greater than or equal to 50%: S
In the case where the elongation retention rate was greater than or equal to 40% and less than 50%: A
In the case where the elongation retention rate was greater than or equal to 35% and less than 40%*B
In the case where the elongation retention rate is greater than or equal to 30% and less than 35%: C
In the case where the elongation retention rate was less than 30%: D.

S to C indicate good, and among them, S indicates the most excellent.

(8) Elongation Retention Rate after Light Resistance Test

After specimens were cut into a shape of measurement pieces (1 cm×20 cm), the measurement pieces were irradiated for 48 hours, by using an EYE Super UV Tester SUV-W131 made by Iwasaki Denki (K.K.), in a condition of a temperature of 60° C., a relative temperature of 60% RH, and an illuminance of 100 mW/cm$^2$ (light source: a metal halide lamp having a wavelength range of 295 nm to 450 nm, and a peak wavelength of 365 nm), and then the fracture elongation was measured according to the foregoing section (6). The measurement was performed with n=5, and after the measurement was performed in both the longitudinal direction and the lateral direction of the film, and an average value thereof was determined as a fracture elongation E2. With regard to the film prior to the foregoing treatment, too, the fracture elongation E0 was measured according to the foregoing section (6), and, by using the thus-obtained fracture elongations E0 and E2, the elongation retention rate was calculated by the following expression:

Elongation retention rate (%)=$E2/E0 \times 100$.

As for the fracture elongation of the backsheet, the fracture elongation of the backsheet prior to the foregoing treatment was represented by E0' as in the foregoing description, and the backsheet was irradiated for 48 hours in a condition of a temperature of 60° C., a relative humidity of 60% RH and an illuminance of 100 mW/cm$^2$ (as the UV light source, a metal halide lamp was used), and a fracture elongation E2' was found, and the elongation retention rate was calculated by the following expression:

Elongation retention rate (%)=$E2'/E0' \times 100$.

The obtained elongation retention rate was judged as follows:
In the case where the elongation retention rate was greater than or equal to 40%: S
In the case where the elongation retention rate was greater than or equal to 30% and less than 40%: A
In the case where the elongation retention rate was greater than or equal to 25% and less than 30%*B
In the case where the elongation retention rate is greater than or equal to 20% and less than 25%: C
In the case where the elongation retention rate was less than 20%: D.

S to C indicate good, and among them, S indicates the most excellent. In the case where the film is a laminate film, ultraviolet-ray irradiation is performed on the side of our polyester film.

(9) Average Relative Reflectance

By using a Spectrophotometer U-3410 (made by Hitachi Seisakujo (K.K.)), the spectral reflectance in the range of wavelength of 400 to 700 nm was measured at intervals of a wavelength of 10 nm, and an average value of the measurements was determined as an average relative reflectance. The number of samples was n–5, the average relative reflectances of the samples were measured, and an average value thereof was calculated. As for a measurement unit, an integrating sphere of φ60 mm (Model No. 130-0632) was used, and a 10°-inclination spacer was attached. Besides, as for a standard white board, aluminum oxide (Model No. 210-0740) was used. Incidentally, in the case where the film is a laminate film, the measurement is performed from the side of our polyester layer.

(10) Anti-Curl Characteristic

The film was cut out into a size of 150 mm×100 mm in width, and the cutout was left standing still for 10 minutes at 140° C. in a no-wind condition, by using a vacuum drier (LKV-122) made by Tabai Espec (K.K.), and then was taken out therefrom, and cooled. After the cooling, the lift heights of the four corners of the film were measured, and an average value thereof was found. As for the measurement, in each of the case where the longer sides of a piece cut out had been in the lengthwise direction of the film and the case where the longer sides of a piece cut out had been in the width direction of the film, the measurement was performed with n=5, and an average value of the measurements was calculated, and the measurement was performed for each of the case of one side surface of the film being in contact with the ground and the case of the other side surface of the film being in contact with the ground, and the large one of the two values was determined as a curl height.

The curl heights were judged as follows:
In the case where the curl height was less than or equal to 5 mm: S
In the case where the curl height was greater than 5 mm and less than or equal to 10 mm: A
In the case where the curl height was greater than 10 mm and less than or equal to 15 mm: B In the case where the curl height was greater than 15 mm and less than or equal to 20 mm: C In the case where the curl height was greater than 20 mm or where the curl was so large that the measurement was impossible: D.

S to C indicate good, and among them, S indicates the most excellent.

(11) Adherence

Backsheets were cut out in a short-strip shape of 15 mm in width×12 cm in length, and the substrate side of each cutout piece was stuck, with a double-stick tape, to an acryl plate of 2 mm in thickness having a smooth surface, and interfaces of polyester films of a working example and a comparative example were partially detached, and the side of the polyester film of each of the example and the comparative example was hung on a load cell of a TENSILON Tension Tester (UTMIII made by Toyo Sokki (K.K.)). Next, the other layer side was held by a lower chuck, and the piece was pulled at a speed of 300 mm/min in a direction of 90° to a planar direction of the backsheet, to measure a peel strength F (N/15 mm) between the polyester film and the other layer. Incidentally, the peel strength was found from an average peel force T (N) of a peal length of 50 mm or more excluding a rising portion of an SS curve.

The obtained peel strengths were judged as follows:

In the case where the peel strength was greater than or equal to 4 N/15 mm: S

In the case where the peel strength was greater than or equal to 3.5 N/15 mm and less than 4 N/15 mm: A In the case where the peel strength was greater than or equal to 3 N/15 mm and less than 3.5 N/15 mm: B In the case where the peel strength was greater than or equal to 2 N/15 mm and less than 3 N/15 mm: C In the case where the peel strength was less than 2 N/15 mm: D.

S to C indicate good, and, among them, S indicates the most excellent.

EXAMPLES

Hereinafter, our films, laminates, backsheets and solar batteries will be described with reference to examples, but this disclosure is not necessarily limited by the examples.

Example 1

By using 100 mol % of terephthalic acid as a dicarboxylic acid component and 100 mol % of ethylene glycol as a diol component, and using magnesium acetate, antimony trioxide and phosphorous acid as catalysts, a polycondensation reaction was performed. Next, after the obtained polyethylene terephthalate was dried and crystallized at 160° C. for 6 hours, it was subjected to a solid-phase polymerization at 220° C. and 0.3 Torr in the degree of vacuum, for 9 hours, to obtain a polyethylene terephthalate (PET) (crystalline polyester resin A) whose melting point was 255° C. Next, by using 95 mol % of terephthalic acid and 5 mol % of isophthalic acid as dicarboxylic acid components, and 100 mol % of cyclohexane dimethanol 100 mol as a diol component, and using magnesium acetate, antimony trioxide and phosphorous acid as catalysts, a polycondensation reaction was performed, to obtain polycyclohexylene dimethylene terephthalate (PCT/I, 5 mol %) (crystalline polyester resin B) containing 5 mol % of isophthalic acid whose melting point was 280° C. 100 parts by weight of the crystalline polyester resin B obtained as described above and 100 parts by weight of rutile-type titanium oxide particles of 200 nm in the average particle diameter were melted and kneaded in a vented extruder at 290° C., to produce a titanium oxide raw material (MB-TiO2).

Next, 64 parts by weight of crystalline polyester resin A having been vacuum-dried at 180° C. for 2 hours and 36 parts by weight of a MB-TiO2 raw material having been vacuum-dried at 180° C. for 2 hours were melted and kneaded in an extruder at 290° C., and the kneaded material was introduced into a T-die. Next, the material was melt-extruded from the T-die into a sheet shape and, by an electrostatic application method, was placed in firm contact with a drum whose surface temperature was kept at 25° C., and thereby was cooled and solidified, to obtain an unstretched single-layer film. Subsequently, after the unstretched single-layer film was pre-heated by a group of rolls heated to a temperature of 80° C., the film was stretched in the lengthwise direction (longitudinal direction) to 3.3 times by using heating rolls at a temperature of 85° C., and then was cooled by a group of rolls at a temperature of 25° C., whereby a monoaxially stretched film was obtained. While two ends of the obtained monoaxially stretched film were held by clips, the film was guided to a pre-heating zone at a temperature of 90° C. within a tenter, and uninterruptedly was stretched to 3.8 times in a direction (width direction) orthogonal to the lengthwise direction in a heating zone that was continuously kept at 100° C. Furthermore, uninterruptedly, the film was subjected to a heat treatment at 200° C. for 20 seconds in the heat treatment zone in the tenter, and was subjected to a loosening treatment at 210° C., 4%, in the width direction. Next, the film was uniformly slowly cooled, to obtain a biaxially stretched film whose thickness was 50 μm.

With regard to the obtained film, evaluation was performed in terms of the degree of flatness of the dispersion phases of the crystalline polyester resin B, the proportion of the titanium oxide particles being present in or being in contact with the dispersion phases of the crystalline polyester resin B, the average relative reflectance, the mechanic characteristic after the moist heat resistance test, and the mechanic characteristic after the light resistance test. As a result, as shown in Table 1, it was found that the crystalline polyester resin B formed flat dispersion phases, and the obtained film was a film excellent in the moist heat resistance, the light resistance and the light reflecting characteristic. A 75 μm-thick biaxially stretched polyester film "Lumirror" (registered trademark) X10S (made by Toray (K.K.)) was bonded together with the obtained film, with an adhesive (a mixture of 90 parts by mass of "Takelec" (registered trademark) A310 (made by Mitsui Takeda Chemical (K.K.)) and 10 parts by weight of "Takenate" (registered trademark) A3 (made by Mitsui Takeda Chemical (K.K.))). A 12 μm-thick gas barrier film "Barrierlocks" (registered trademark) VM-PET1031HGTS (made by Toray Film Kako (K.K.)) was bonded to the biaxially stretched polyester film side with the aforementioned adhesive so that the vapor deposition layer disposed on the outer side, whereby a solar battery backsheet of 188 μm in thickness was produced. Evaluation of the moist heat resistance and the light resistance of the obtained backsheet was carried out, and it was found that the backsheet had high moist heat resistance and high light resistance, as shown in Table 1.

Examples 2 to 5, 21 and 22

Biaxially stretched film were obtained in substantially the same manner as in Example 1, except that in a manufacturing step of the film, the stretch ratio was changed as shown in Table 1.

With regard to the obtained films, evaluation was performed in terms of the degree of flatness of the dispersion phases of the crystalline polyester resin B, the proportion of the titanium oxide particles being present in or being in contact with the dispersion phases of the crystalline polyester resin B, the average relative reflectance, the mechanic characteristic after the moist heat resistance test, and the mechanic characteristic after the light resistance test. As a result, as shown in Table 1, it was found that the films were films that were good in the moist heat resistance, the light resistance and the light reflecting characteristic, and that the higher the degree of flatness of the crystalline polyester resin B of a film was, the better in the moist heat resistance the film was. By using the films, solar battery backsheets were produced in substantially the same manner as in Example 1, and evaluation of the moist heat resistance and the light resistance thereof were carried out. As shown in Table 1, it was found that the backsheets had good moist heat resistance and good ultraviolet ray resistance.

Example 6

A film was obtained in substantially the same manner as in Example 1, except that as the crystalline polyester resin B, there was used polycyclohexylene dimethylene terephthalate (PCT/I, 8 mol %) containing 8 mol % of isophthalic acid whose melting point was 270° C. and which was obtained by performing a polycondensation reaction by using 92 mol % of terephthalic acid and 8 mol % of isophthalic acid as dicarboxylic acid components, and 100 mol % of cyclohexane dimethanol as a diol component, and using magnesium acetate, antimony trioxide and phosphorous acid as catalysts. With regard to the obtained film, evaluation was performed in terms of the degree of flatness of the dispersion phases of the crystalline polyester resin B, the proportion of the titanium oxide particles being present in or being in contact with the dispersion phases of the crystalline polyester resin B, the average relative reflectance, the mechanic characteristic after the moist heat resistance test, and the mechanic characteristic after the light resistance test. As a result, as shown in Table 1, it was found that the film was a film that was good in the moist heat resistance, the light resistance and the light reflecting characteristic. By using this film, a solar battery backsheet was produced in substantially the same manner as in Example 1, and evaluation of the moist heat resistance and the light resistance was carried out. As shown in Table 1, it was found that the backsheet had good moist heat resistance and good light resistance.

Example 7

A film was obtained in substantially the same manner as in Example 1, except that as the crystalline polyester resin B, there was used polycyclohexylene dimethylene terephthalate (PCT/I, 10 mol %) containing 10 mol % of isophthalic acid whose melting point was 266° C. and which was obtained by performing a polycondensation reaction by using 90 mol % of terephthalic acid and 10 mol % of isophthalic acid as dicarboxylic acid components, and 100 mol % of cyclohexane dimethanol as a diol component, and using magnesium acetate, antimony trioxide and phosphorous acid as catalysts. With regard to the obtained film, evaluation was performed in terms of the degree of flatness of the dispersion phases of the crystalline polyester resin B, the proportion of the titanium oxide particles being present in or being in contact with the dispersion phases of the crystalline polyester resin B, the average relative reflectance, the mechanic characteristic after the moist heat resistance test, and the mechanic characteristic after the light resistance test. As a result, as shown in Table 1, it was found that the film was a film that was good in the moist heat resistance, the light resistance and the light reflecting characteristic. By using this film, a solar battery backsheet was produced in substantially the same manner as in Example 1, and evaluation of the moist heat resistance and the light resistance was carried out. As shown in Table 1, it was found that the backsheet had good moist heat resistance and good light resistance.

Example 8

A film was obtained in substantially the same manner as in Example 1, except that as the crystalline polyester resin B, there was used polycyclohexylene dimethylene terephthalate (PCT) whose melting point was 290° C. and which was obtained by performing a polycondensation reaction by using 100 mol % of terephthalic acid as a dicarboxylic acid components, and 100 mol % of cyclohexane dimethanol as a diol component, and using magnesium acetate, antimony trioxide and phosphorous acid as catalysts. With regard to the obtained film, evaluation was performed in terms of the degree of flatness of the dispersion phases of the crystalline polyester resin B, the proportion of the titanium oxide particles being present in or being in contact with the dispersion phases of the crystalline polyester resin B, the average relative reflectance, the mechanic characteristic after the moist heat resistance test, and the mechanic characteristic after the light resistance test. As a result, as shown in Table 1, it was found that the film was a film having very excellent moist heat resistance, and excellent light resistance and excellent light reflecting characteristic. By using this film, a solar battery backsheet was produced in substantially the same manner as in Example 1, and evaluation of the moist heat resistance and the light resistance was carried out. As shown in Table 1, it was found that the backsheet had very excellent moist heat resistance and excellent light resistance.

Example 9

A film was obtained in substantially the same manner as in Example 1, except that a titanium oxide raw material (MB-TiO2) mastered with the crystalline polyester resin B was produced by melt-kneading 100 parts by weight of the crystalline polyester resin B and 50 parts by weight of rutile-type titanium oxide particles of 200 nm in the average particle diameter in a vented extruder at 290° C., and then melt-kneading 46 parts by weight of the crystalline polyester resin A having been vacuum-dried at 180° C. for 2 hours and 54 parts by weight of the MB-TiO2 raw material having been vacuum-dried at 180° C. for 2 hours in an extruder at 290° C., and introducing it into a T-die. With regard to the obtained film, evaluation was performed in terms of the degree of flatness of the dispersion phases of the crystalline polyester resin B, the proportion of the titanium oxide particles being present in or being in contact with the dispersion phases of the crystalline polyester resin B, the average relative reflectance, the mechanic characteristic after the moist heat resistance test, and the mechanic characteristic after the light resistance test. As a result, as shown in Table 1, it was found that the film was a film having very excellent moist heat resistance, and good light resistance and good light reflecting characteristic. By using this film, a solar battery backsheet was produced in substantially the same manner as in Example 1, and evaluation of the moist heat resistance and the light resistance was carried out. As shown in Table 1, it was found that the backsheet had very excellent moist heat resistance and good light resistance.

Example 10

A film was obtained in substantially the same manner as in Example 1, except that a titanium oxide raw material (MB-TiO2) mastered with the crystalline polyester resin B was produced by melt-kneading 100 parts by weight of the crystalline polyester resin B and 60 parts by weight of rutile-type titanium oxide particles of 200 nm in the average particle diameter in a vented extruder at 290° C., and then melt-kneading 52 parts by weight of the crystalline polyester resin A having been vacuum-dried at 180° C. for 2 hours and 48 parts by weight of the MB-TiO2 raw material having been vacuum-dried at 180° C. for 2 hours in an extruder at 290° C., and introducing it into a T-die. With regard to the obtained film, evaluation was performed in terms of the degree of flatness of the dispersion phases of the crystalline polyester resin B, the proportion of the titanium oxide particles being present in or being in contact with the dispersion phases of the crystalline polyester resin B, the average relative reflectance, the mechanic characteristic after the moist heat resistance test, and the mechanic characteristic after the light resistance test. As a result, as shown in Table 1, it was found that the film was a film having very excellent moist heat resistance, and good light resistance and good light reflecting characteristic. By using this film, a solar battery backsheet was produced in substantially the same manner as in Example 1, and evaluation of the moist heat resistance and the light resistance was carried out. As shown in Table 1, it was found that the backsheet had very excellent moist heat resistance and good light resistance.

Example 11

A film was obtained in substantially the same manner as in Example 1, except that a titanium oxide raw material (MB-TiO2) mastered with the crystalline polyester resin B was produced by melt-kneading 33 parts by weight of the crystalline polyester resin B and 100 parts by weight of rutile-type titanium oxide particles of 200 nm in the average particle diameter in a vented extruder at 290° C., and then melt-kneading 76 parts by weight of the crystalline polyester resin A having been vacuum-dried at 180° C. for 2 hours and 24 parts by weight of the MB-TiO2 raw material having been vacuum-dried at 180° C. for 2 hours in an extruder at 290° C., and introducing it into a T-die. The MG-TiO2 raw material was brittle, and therefore the handling characteristic thereof become bad. With regard to the obtained film, evaluation was performed in terms of the degree of flatness of the dispersion phases of the crystalline polyester resin B, the proportion of the titanium oxide particles being present in or being in contact with the dispersion phases of the crystalline polyester resin B, the average relative reflectance, the mechanic characteristic after the moist heat resistance test, and the mechanic characteristic after the light resistance test. As shown in Table 1, it was found that the film was a film having good moist heat resistance, and excellent light resistance. By using this film, a solar battery backsheet was produced in substantially the same manner as in Example 1, and evaluation of the moist heat resistance and the light resistance was carried out. As shown in Table 1, it was found that the backsheet had good moist heat resistance and excellent light resistance.

Example 12

A film was obtained in substantially the same manner as in Example 1, except that a titanium oxide raw material (MB-TiO2) mastered with the crystalline polyester resin B was produced by melt-kneading 17 parts by weight of the crystalline polyester resin B and 100 parts by weight of rutile-type titanium oxide particles of 200 nm in the average particle diameter in a vented extruder at 290° C., and then melt-kneading 79 parts by weight of the crystalline polyester resin A having been vacuum-dried at 180° C. for 2 hours and 21 parts by weight of the MB-TiO2 raw material having been vacuum-dried at 180° C. for 2 hours in an extruder at 290° C., and introducing it into a T-die. The MB-TiO2 raw material was brittle, and therefore the handling characteristic thereof became bad. With regard to the obtained film, evaluation was performed in terms of the degree of flatness of the dispersion phases of the crystalline polyester resin B, the proportion of the titanium oxide particles being present in or being in contact with the dispersion phases of the crystalline polyester resin B, the average relative reflectance, the mechanic characteristic after the moist heat resistance test, and the mechanic characteristic after the light resistance test. As shown in Table 1, it was found that the film was a film having good moist heat resistance, and excellent light resistance and excellent light reflecting characteristic. By using this film, a solar battery backsheet was produced in substantially the same manner as in Example 1, and evaluation of the moist heat resistance and the light resistance was carried out. As shown in Table 1, it was found that the backsheet had good moist heat resistance, excellent light resistance and excellent light reflecting characteristic.

Example 13

A film whose entire thickness was 50 μm was obtained in substantially the same manner as in Example 1, except that, as an X layer, 64 parts by weight of the crystalline polyester resin A having been vacuum-dried at 180° C. for 2 hours, which was used in Example 1 as well, and 36 parts by weight of MB-TiO2 raw material having been vacuum-dried at 180° C. for 2 hours, which was used in Example 1 as well, were supplied at 290° C. from an extruder X, and as a Y layer, 100 parts by weight of the crystalline polyester A having been dried at 180° C. for 2 hours, which was used in Example 1 as well, was supplied at 280° C. from an extruder Y, and the supplies were caused to flow together via a pinole and introduced into a T-die so that a two-layer film of an X layer/Y layer lamination was formed. The lamination ratio of the obtained film was X layer:Y layer=1:4. With regard to the obtained laminate film, evaluation was performed in terms of the degree of flatness of the dispersion phases of the crystalline polyester resin B, the proportion of the titanium oxide particles being present in or being in contact with the dispersion phases of the crystalline polyester resin B, the average relative reflectance, the mechanic characteristic after the moist heat resistance test, and the mechanic characteristic after the light resistance test, in the X layer. As shown in Table 1, it was found that the film was a film having excellent moist heat resistance, and excellent light resistance and excellent light reflecting characteristic. By using the X layer of this film as a P layer, a solar battery backsheet was produced in substantially the same manner as in Example 1 but so that the surface of the P layer is at an outer side, and evaluation of the moist heat resistance and the light resistance was carried out. As shown in Table 1, it was found that the backsheet had excellent moist heat resistance and excellent light resistance.

Example 14

A film whose entire thickness was 50 μm was obtained in substantially the same manner as in Example 1, except that, as an X layer, 64 parts by weight of the crystalline polyester resin A having been vacuum-dried at 180° C. for 2 hours, which was used in Example 1 as well, and 36 parts by weight of MB-TiO2 raw material having been vacuum-dried at 180° C. for 2 hours, which was used in Example 1 as well, were supplied at 290° C. from an extruder X, and as a Y layer, 100 parts by weight of the crystalline polyester A having been dried at 180° C. for 2 hours, which was used in Example 1 as well, was supplied at 280° C. from an extruder Y, and the supplies were caused to flow together via a pinole and introduced into a T-die so that a three-layer film of an X layer/Y layer/X layer lamination was formed. The lamination ratio of the obtained film was X layer:Y layer:X layer=1:4:1. With regard to the obtained laminate film, evaluation was performed in terms of the degree of flatness of the dispersion phases of the crystalline polyester resin B, the proportion of the titanium oxide particles being present in or being in contact with the dispersion phases of the crystalline polyester resin B, the average relative reflectance, the mechanic characteristic after the moist heat resistance test, and the mechanic characteristic after the light resistance test, in the X layers. As shown in Table 1, it was found that the film was a film having excellent moist heat resistance, and excellent light resistance and excellent light reflecting characteristic. A solar battery backsheet was produced in substantially the same manner as in Example 1 but so that this film is the outermost layer, and evaluation of the moist heat resistance and the light resistance was carried out. As shown in Table 1, it was found that the backsheet had excellent moist heat resistance and excellent light resistance.

Example 15

A film was obtained in substantially the same manner as in Example 1, except that 62 parts by weight of the crystalline polyester resin A having been vacuum-dried at 180° C. for 2 hours, which was used in Example 1 as well, 2 parts by weight of triazine-based ultraviolet absorbing agent TINUVIN1577FF (made by Ciba Specialty Chemicals Inc.) and 27 parts by weight of the MB-TiO2 raw material having been vacuum-dried at 180° C. for 2 hours, which was used in Example 1 as well, were melt-kneaded in an extruder at 290° C., and introduced into a T-die. With regard to the obtained film, evaluation was performed in terms of the degree of flatness of the dispersion phases of the crystalline polyester resin B, the proportion of the titanium oxide particles being present in or being in contact with the dispersion phases of the crystalline polyester resin B, the average relative reflectance, the mechanic characteristic after the moist heat resistance test, and the mechanic characteristic after the light resistance test. As shown in Table 1, it was found that the film was a film having good moist heat resistance, and excellent light resistance and excellent light reflecting characteristic. By using this film, a solar battery backsheet was produced in substantially the same manner as in Example 1, and evaluation of the moist heat resistance and the light resistance was carried out. As shown in Table 1, it was found that the backsheet had good moist heat resistance and excellent light resistance.

Example 16

A carbon-based compound raw material (MA-CB) mastered with the crystalline polyester resin A was produced by melt-kneading 90 parts by weight of the crystalline polyester resin A obtained in Example 1 and 10 parts by weight of carbon-based compound particles of 10 to 50 nm in the average particle diameter (#50 made by Mitsubishi Kagaku (K.K.) Company) in a vented extruder at 290° C. A film was obtained in substantially the same manner as in Example 1, except that 44 parts by weight of the crystalline polyester resin A having been vacuum-dried at 180° C. for 2 hours, which was used in Example 1 as well, 20 parts by weight of the MA-CB raw material having been vacuum-dried at 180° C. for 2 hours and 36 parts by weight of the MB-TiO2 raw material having been vacuum-dried at 180° C. for 2 hours, which was used in Example 1 as well, were melt-kneaded in an extruder at 290° C., and introduced into a T-die. With regard to the obtained film, evaluation was performed in terms of the degree of flatness of the dispersion phases of the crystalline polyester resin B, the proportion of the titanium oxide particles and the carbon-based compound particles being present in or being in contact with the dispersion phases of the crystalline polyester resin B, the average relative reflectance, the mechanic characteristic after the moist heat resistance test, and the mechanic characteristic after the light resistance test. As shown in Table 1, it was found that the film was a film having excellent moist heat resistance and good light resistance. By using this film, a solar battery backsheet was produced in substantially the same manner as in Example 1, and evaluation of the moist heat resistance and the light resistance was carried out. As shown in Table 1, it was found that the backsheet had excellent moist heat resistance and good ultraviolet ray resistance.

Example 17

A carbon-based compound raw material (MB-CB) mastered with the crystalline polyester resin B was produced by melt-kneading 85 parts by weight of the crystalline polyester resin B obtained in Example 1 and 15 parts by weight of carbon-based compound particles of 10 to 50 nm in the average particle diameter (#50 made by Mitsubishi Kagaku (K.K.) Company) in a vented extruder at 290° C. A film was obtained in substantially the same manner as in Example 1, except that 79 parts by weight of the crystalline polyester resin A having been vacuum-dried at 180° C. for 2 hours, which was used in Example 1 as well and 21 parts by weight of the MB-CB raw material having been vacuum-dried at 180° C. for 2 hours were melt-kneaded in an extruder at 290° C., and introduced into a T-die. With regard to the obtained film, evaluation was performed in terms of the degree of flatness of the dispersion phases of the crystalline polyester resin B, the proportion of the titanium oxide particles and the carbon-based compound particles being present in or being in contact with the dispersion bodies of the crystalline polyester resin B, the average relative reflectance, the mechanic characteristic after the moist heat resistance test, and the mechanic characteristic after the light resistance test. As shown in Table 1, it was found that the film was a film having excellent moist heat resistance and good light resistance. By using this film, a solar battery backsheet was produced in substantially the same manner as in Example 1, and evaluation of the moist heat resistance and the light resistance was carried out. As shown in Table 1, it was found that the backsheet had excellent moist heat resistance and good ultraviolet ray resistance.

Example 18

A film was obtained in substantially the same manner as in Example 1, except that zinc oxide particles of 100 nm in the average particle diameter were used. With regard to the obtained film, evaluation was performed in terms of the degree of flatness of the dispersion phases of the crystalline polyester resin B, the proportion of the zinc oxide particles being present in or being in contact with the dispersion phases of the crystalline polyester resin B, the average relative reflectance, the mechanic characteristic after the moist heat resistance test, and the mechanic characteristic after the light resistance test. As shown in Table 1, it was found that the film was a film having excellent moist heat resistance, and good light resistance and good light reflecting characteristic. By using this film, a solar battery backsheet was produced in substantially the same manner as in Example 1, and evaluation of the moist heat resistance and the light resistance was carried out. As shown in Table 1, it was found that the backsheet had excellent moist heat resistance and good light resistance.

Example 19

A film was obtained in substantially the same manner as in Example 1, except that barium sulfate particles of 700 nm in the average particle diameter were used. With regard to the obtained film, evaluation was performed in terms of the degree of flatness of the dispersion phases of the crystalline polyester resin B, the proportion of the barium sulfate particles being present in or being in contact with the dispersion phases of the crystalline polyester resin B, the average relative reflectance, the mechanic characteristic after the moist heat resistance test, and the mechanic characteristic after the light resistance test. As shown in Table 1, it was found that the film was a film having excellent moist heat resistance, and good light resistance and high light reflecting characteristic. By using this film, a solar battery backsheet was produced in substantially the same manner as in Example 1, and evaluation of the moist heat resistance and the light resistance was carried out. As shown in Table 1, it was found that the backsheet had excellent moist heat resistance and good light resistance.

Example 20

A film was obtained in substantially the same manner as in Example 1, except that as for the crystalline polyester resin A, a polycondensation reaction was performed by using 100 mol % of naphthalene dicarboxylic acid as a dicarboxylic acid component, and 100 mol % of ethylene glycol as a diol component, and using magnesium acetate, antimony trioxide and phosphorous acid as catalysts, and polyethylene naphthalate (PEN) whose melting point was 263° C. was used. With regard to the obtained film, evaluation was performed in terms of the degree of flatness of the dispersion phases of the crystalline polyester resin B, the proportion of the titanium oxide particles being present in or being in contact with the dispersion phases of the crystalline polyester resin B, the average relative reflectance, the mechanic characteristic after the moist heat resistance test, and the mechanic characteristic after the light resistance test. As shown in Table 1, it was found that the film was a film having excellent moist heat resistance, and good light resistance. By using this film, a solar battery backsheet was produced in substantially the same manner as in Example 1, and evaluation of the moist heat resistance and the light resistance was carried out. As shown in Table 1, it was found that the backsheet had excellent moist heat resistance and good light resistance.

Example 23

A film whose entire thickness was 50 μm was obtained in substantially the same manner as in Example 1, except that, as an X layer, 64 parts by weight of the crystalline polyester resin A having been vacuum-dried at 180° C. for 2 hours, which was used in Example 1 as well, and 36 parts by weight of MB-TiO2 raw material having been vacuum-dried at 180° C. for 2 hours, which was used in Example 1 as well, were supplied at 290° C. from an extruder X, and as a Y layer, 99 parts by weight of the crystalline polyester A having been dried at 180° C. for 2 hours, which was used in Example 1 as well, and 1 part by weight of the MB-TiO2 raw material having been vacuum-dried at 180° C. for 2 hours, which was used in Example 1 as well, were supplied at 290° C. from an extruder Y, and the supplies were caused to flow together via a pinole and introduced into a T-die so that a two-layer film of an X layer/Y layer lamination was formed. The lamination ratio of the obtained film was X layer:Y layer=1:4. With regard to the obtained laminate film, evaluation was performed in terms of the degree of flatness of the dispersion phases of the crystalline polyester resin B, the proportion of the titanium oxide particles being present in or being in contact with the dispersion phases of the crystalline polyester resin B, the average relative reflectance, the mechanic characteristic after the moist heat resistance test, and the mechanic characteristic after the light resistance test, in the X layer. As shown in Table 1, it was found that the film was a film having excellent moist heat resistance, and excellent light resistance and excellent light reflecting characteristic. By using the X layer of this film as a P layer, a solar battery backsheet was produced in substantially the same manner as in Example 1 but so that the surface of the P layer is at an outer side, and evaluation of the moist heat resistance and the light resistance was carried out. As shown in Table 1, it was found that the backsheet had excellent moist heat resistance and excellent light resistance, and had higher adherence in comparison with Example 1.

Examples 24 to 26

Films whose entire thickness was 50 μm were obtained in substantially the same manner in Example 14, except that materials as follows were used as a Y-layer material:

Example 24

98 parts by weight of the crystalline polyester A, and 2 parts by weight of the MB-TiO2 raw material, which was used in Example 1 as well Example 25

94 parts by weight of the crystalline polyester A, and 6 parts by weight of the MB-TiO2 raw material, which was used in Example 1 as well Example 26

90 parts by weight of the crystalline polyester A, and 10 parts by weight of the MB-TiO2 raw material, which was used in Example 1 as well Example 27

88 parts by weight of the crystalline polyester A, and 12 parts by weight of the MB-TiO2 raw material, which was used in Example 1 as well.

With regard to the obtained laminate films, evaluation was performed in terms of the degree of flatness of the dispersion phases of the crystalline polyester resin B, the proportion of the titanium oxide particles being present in or being in contact with the dispersion phases of the crystalline polyester resin B, the average relative reflectance, the mechanic characteristic after the moist heat resistance test, and the mechanic characteristic after the light resistance test, in the X layer. As shown in Table 1, it was found that the film was a film having excellent moist heat resistance, and excellent light resistance and excellent light reflecting characteristic, and was excellent in the anti-curl characteristic. By using the X layer of the films as a P layer, solar battery backsheets were produced in substantially the same manner as in Example 1 but so that the surface of the P layer is at an outer side, and evaluation of the moist heat resistance and the light resistance was carried out. As shown in Table 1, it was found that the backsheets had excellent moist heat resistance and excellent light resistance, and that Examples 24 to 26 had higher adherence in comparison with Example 1.

Comparative Example 1

A film was obtained in substantially the same manner as in Example 1, except that 82 parts by weight of the crystalline polyester resin A having been vacuum-dried at 180° C. for 2 hours, which was used in Example 1 as well, and 18 parts by weight of the crystalline polyester resin B having been vacuum-dried at 180° C. for 2 hours, which was used in Example 1 as well, were melt-kneaded in an extruder at 290° C., and introduced into a T-die. With regard to the obtained film, evaluation was performed in terms of the degree of flatness of the dispersion phase of the crystalline polyester resin B, the average relative reflectance, the mechanic characteristic after the moist heat resistance test, and the mechanic characteristic after the light resistance test. As shown in Table 1, the dispersion phases of the crystalline polyester resin B were formed, and excellent moist heat resistance was achieved; however, since the films did not contain particles, they were inferior in the light resistance. By using the films, solar battery back-sheets were produced in substantially the same manner as in Example 1, and evaluation of the moist heat resistance and the light resistance was carried out. As shown in Table 1, it was found that the backsheets had excellent moist heat resistance but were inferior in the light resistance.

Comparative Example 2

A titanium oxide raw material (MA-TiO2) mastered with the crystalline polyester resin A was produced by melt-kneading 100 parts by weight of the crystalline polyester resin A, which was used in Example 1 as well, and 100 parts by weight of the rutile-type titanium oxide particles of 200 nm in the average particle diameter in a vented extruder at 280° C.

Subsequently, a film was obtained in substantially the same manner as in Example 1, except that 64 parts by weight of the crystalline polyester resin A having been vacuum-dried at 180° C. for 2 hours and 36 parts by weight of the MA-TiO2 raw material having been vacuum-dried at 180° C. for 2 hours were melt-kneaded in an extruder at 280° C., and introduced into a T-die. With regard to the obtained film, evaluation was performed in terms of the average relative reflectance, the mechanic characteristic after the moist heat resistance test, and the mechanic characteristic after the light resistance test. As shown in Table 1, the light resistance was good; however, since a sea-island structure was not formed, the film was inferior in the moist heat resistance. By using the film, a solar battery backsheet was produced in substantially the same manner as in Example 1, and evaluation of the moist heat resistance and the light resistance was carried out. As shown in Table 1, it was found that the backsheet was inferior in the moist heat resistance.

Comparative Example 3

A film was obtained in substantially the same manner as in Example 1, except that as for the crystalline polyester resin B, a polycondensation reaction is performed by using 100 mol % of naphthalene dicarboxylic acid as a dicarboxylic acid component, and 100 mol % of ethylene glycol as a diol component, and using magnesium acetate, antimony trioxide and phosphorous acid as catalysts, and polyethylene naphthalate (PEN) whose melting point was 263° C. was used. With regard to the obtained film, dispersion phases by the crystalline polyester resin B were not formed, and the moist heat resistance was poor. By using the film, a solar battery backsheet was produced in substantially the same manner as in Example 1, and evaluation of the moist heat resistance and the light resistance was carried out. As shown in Table 1, it was found that the backsheet was inferior in the moist heat resistance.

Comparative Example 4

A film was obtained in substantially the same manner as in Example 1, except that as the crystalline polyester resin B, there was used polycyclohexylene dimethylene terephthalate (PCT/I, 16 mol %) containing 16 mol % of isophthalic acid whose melting point was 258° C. and which was obtained by performing a polycondensation reaction by using 84 mol % of terephthalic acid and 16 mol % of isophthalic acid as dicarboxylic acid components, and 100 mol % of cyclohexane dimethanol as a diol component, and using magnesium acetate, antimony trioxide and phosphorous acid as catalysts. With regard to the obtained film, evaluation was performed in terms of the degree of flatness of the dispersion phases of the crystalline polyester resin B, the proportion of the titanium oxide particles being present in or being in contact with the dispersion phases of the crystalline polyester resin B, the average relative reflectance, the mechanic characteristic after the moist heat resistance test, and the mechanic characteristic after the light resistance test. As shown in Table 1, although dispersion phases of the crystalline polyester resin B were formed, the degree of flatness was small, and the moist heat resistance was poor. By using this film, a solar battery backsheet was produced in substantially the same manner as in Example 1, and evaluation of the moist heat resistance and the light resistance was carried out. As shown in Table 1, it was found that the backsheet was inferior in moist heat resistance.

Comparative Example 5

A titanium oxide raw material (MA-TiO2) mastered with the crystalline polyester resin A was produced by melt-kneading 100 parts by weight of the crystalline polyester resin A, which was used in Example 1, and 100 parts by weight of rutile-type titanium oxide particles of 200 nm in the average particle diameter in a vented extruder at 280° C. Next, a film was obtained in substantially the same manner as in Example 1, except that 46 parts by weight of the crystalline polyester resin A having been vacuum-dried at 180° C. for two hours, which was used in Example 1 as well, 36 parts by weight of the MA-TiO2 raw material having been vacuum-dried at 180° C. for two hours, and 18 parts by weight of the crystalline polyester resin B having been vacuum-dried 180° C. for two hours, which was used in Example 1 as well, were melt-kneaded in an extruder at 290° C., and then introduced into a T-die. With regard to the obtained film, evaluation was performed in terms of the degree of flatness of the dispersion phases of the crystalline polyester resin B, the proportion of the titanium oxide particles being present in or being in contact with the dispersion phases of the crystalline polyester resin B, the average relative reflectance, the mechanic characteristic after the moist heat resistance test, and the mechanic characteristic after the light resistance test. As shown in Table 1, although dispersion phases of the crystalline polyester resin B were formed, the proportion of the titanium oxide particles that were present in or were in contact with the crystalline polyester resin B was small, and the moist heat resistance was poor. By using this film, a solar battery backsheet was produced in substantially the same manner as in Example 1, and evaluation of the moist heat resistance and the light resistance was carried out. As shown in Table 1, it was found that the backsheet was inferior in moist heat resistance.

Comparative Example 6

A film was obtained in substantially the same manner as in Example 1, except that 55 parts by weight of the crystalline polyester resin A having been vacuum-dried at 180° C. for 2 hours, which was used in Example 1 as well, 9 parts by weight of the crystalline polyester resin B having been vacuum-dried at 180° C. for 2 hours, 18 parts by weight of the titanium oxide raw material (MB-TiO2) having been dried at 180° C. for 2 hours, which was used in Example 1 as well, and 18 parts by weight of the titanium oxide raw material (MA-TiO2) having been vacuum-dried at 180° C. for 2 hours, which was used in Comparative Example 5 as well, were melt-kneaded in an extruder at 290° C., and introduced into a T-die. With regard to the obtained film, evaluation was performed in terms of the degree of flatness of the dispersion phases of the crystalline polyester resin B, the proportion of the titanium oxide particles being present in or being in contact with the dispersion phases of the crystalline polyester resin B, the average relative reflectance, the mechanic characteristic after the moist heat resistance test, and the mechanic characteristic after the light resistance test. As shown in Table 1, although dispersion phases of the crystalline polyester resin B were formed, the proportion of the titanium oxide particles that were present in or were in contact with the crystalline polyester resin B was small, and the moist heat resistance was poor. By using the films, solar battery backsheets were produced in substantially the same manner as in Example 1, and evaluation of the moist heat resistance and the light resistance was carried out. As shown in Table 1, it was found that the backsheets had excellent moist heat resistance but were inferior in the light resistance.

Comparative Example 7

A titanium oxide raw material (MAB-TiO2) mastered with the crystalline polyester resin A and the crystalline polyester resin B was produced by melt-kneading 64 parts by weight of the crystalline polyester resin A which was used in Example 1 as well, 18 parts by weight of the crystalline polyester resin B which was used in Example 1 as well, and 18 parts by weight of rutile-type titanium oxide particles of 200 nm in the average particle diameter in a vented extruder at 280° C. A film was obtained in substantially the same manner as in Example 1, except that 100 parts by weight of the titanium oxide raw material (MAB-TiO2) having been vacuum-dried at 180° C. for 2 hours was melt-kneaded in an extruder at 290° C., and introduced into a T-die. With regard to the obtained film, evaluation was performed in terms of the degree of flatness of the dispersion phases of the crystalline polyester resin B, the proportion of the titanium oxide particles being present in or being in contact with the dispersion phases of the crystalline polyester resin B, the average relative reflectance, the mechanic characteristic after the moist heat resistance test, and the mechanic characteristic after the light resistance test. As shown in Table 1, although dispersion phases of the crystalline polyester resin B were formed, the proportion of the titanium oxide particles that were present in or were in contact with the crystalline polyester resin B was small, and the moist heat resistance was poor. By using the films, solar battery backsheets were produced in substantially the same manner as in Example 1, and evaluation of the moist heat resistance and the light resistance was carried out. As shown in Table 1, it was found that the backsheets had excellent moist heat resistance but were inferior in the light resistance.

TABLE 1

| | Composition | | | | Proportion of addition (wt. %) | | | | TccA − | | | | |
|---|---|---|---|---|---|---|---|---|---|---|---|---|---|
| | Crystalline polyester resin A [A] | Crystalline polyester resin B [B] | Particle | Additive | [A] | [B] | Particle | Additive | TccA (° C.) | TccB (° C.) | TccB (° C.) | TmA (° C.) | TmB (° C.) | TmB − TmA (° C.) |
| Example 1 | PET | PCT/I(5 mol %) | Titanium oxide | — | 64 | 18 | 18 | — | 160 | 140 | 20 | 255 | 280 | 25 |
| Example 2 | PET | PCT/I(5 mol %) | Titanium oxide | — | 64 | 18 | 18 | — | 160 | 140 | 20 | 255 | 280 | 25 |
| Example 3 | PET | PCT/I(5 mol %) | Titanium oxide | — | 64 | 18 | 18 | — | 160 | 140 | 20 | 255 | 280 | 25 |
| Example 4 | PET | PCT/I(5 mol %) | Titanium oxide | — | 64 | 18 | 18 | — | 160 | 140 | 20 | 255 | 280 | 25 |
| Example 5 | PET | PCT/I(5 mol %) | Titanium oxide | — | 64 | 18 | 18 | — | 160 | 140 | 20 | 255 | 280 | 25 |
| Example 6 | PET | PCT/I(8 mol %) | Titanium oxide | — | 64 | 18 | 18 | — | 160 | 148 | 12 | 255 | 270 | 15 |
| Example 7 | PET | PCT/I(10 mol %) | Titanium oxide | — | 64 | 18 | 18 | — | 160 | 155 | 5 | 255 | 266 | 11 |
| Example 8 | PET | PCT | Titanium oxide | — | 64 | 18 | 18 | — | 160 | 130 | 30 | 255 | 290 | 35 |
| Example 9 | PET | PCT/I(5 mol %) | Titanium oxide | — | 46 | 36 | 18 | — | 160 | 140 | 20 | 255 | 280 | 25 |
| Example 10 | PET | PCT/I(5 mol %) | Titanium oxide | — | 52 | 30 | 18 | — | 160 | 140 | 20 | 255 | 280 | 25 |
| Example 11 | PET | PCT/I(5 mol %) | Titanium oxide | — | 76 | 6 | 18 | — | 160 | 140 | 20 | 255 | 280 | 25 |
| Example 12 | PET | PCT/I(5 mol %) | Titanium oxide | — | 79 | 3 | 18 | — | 160 | 140 | 20 | 255 | 280 | 25 |
| Example 13 | PET | PCT/I(5 mol %) | Titanium oxide | — | 64 | 18 | 18 | — | 160 | 140 | 20 | 255 | 280 | 25 |
| Example 14 | PET | PCT/I(5 mol %) | Titanium oxide | — | 64 | 18 | 18 | — | 160 | 140 | 20 | 255 | 280 | 25 |
| Example 15 | PET | PCT/I(5 mol %) | Titanium oxide | UVA | 62 | 18 | 18 | 2 | 160 | 140 | 20 | 255 | 280 | 25 |
| Example 16 | PET | PCT/I(5 mol %) | Titanium oxide/carbon-based | — | 62 | 18 | 20 | — | 160 | 140 | 20 | 255 | 280 | 25 |

TABLE 1-continued

| | | | | | | | | | | | | | |
|---|---|---|---|---|---|---|---|---|---|---|---|---|---|
| Example 17 | PET | PCT/I(5 mol %) | Carbon-based compound | — | 79 | 18 | 3 | — | 160 | 140 | 20 | 255 | 280 | 25 |
| Example 18 | PET | PCT/I(5 mol %) | Zinc oxide | — | 64 | 18 | 18 | — | 160 | 140 | 20 | 255 | 280 | 25 |
| Example 19 | PET | PCT/I(5 mol %) | Barium sulfate | — | 64 | 18 | 18 | — | 160 | 140 | 20 | 255 | 280 | 25 |
| Example 20 | PEN | PCT/I(5 mol %) | Titanium oxide | — | 64 | 18 | 18 | — | 230 | 140 | 90 | 263 | 280 | 17 |
| Example 21 | PET | PCT/I(5 mol %) | Titanium oxide | — | 64 | 18 | 18 | — | 160 | 140 | 20 | 255 | 280 | 25 |
| Example 22 | PET | PCT/I(5 mol %) | Titanium oxide | — | 64 | 18 | 18 | — | 160 | 140 | 20 | 255 | 280 | 25 |
| Example 23 | PET | PCT/I(5 mol %) | Titanium oxide | — | 64 | 18 | 18 | — | 160 | 140 | 20 | 255 | 280 | 25 |
| Example 24 | PET | PCT/I(5 mol %) | Titanium oxide | — | 64 | 18 | 18 | — | 160 | 140 | 20 | 255 | 280 | 25 |
| Example 25 | PET | PCT/I(5 mol %) | Titanium oxide | — | 64 | 18 | 18 | — | 160 | 140 | 20 | 255 | 280 | 25 |
| Example 26 | PET | PCT/I(5 mol %) | Titanium oxide | — | 64 | 18 | 18 | — | 160 | 140 | 20 | 255 | 280 | 25 |
| Example 27 | PET | PCT/I(5 mol %) | Titanium oxide | — | 64 | 18 | 18 | — | 160 | 140 | 20 | 255 | 280 | 25 |
| Comparative example 1 | PET | PCT/I(5 mol %) | — | — | 82 | 18 | — | — | 160 | 140 | 20 | 255 | 280 | 25 |
| Comparative example 2 | PET | PET | Titanium oxide | — | 64 | 18 | 18 | — | 160 | 160 | 0 | 255 | 255 | 0 |
| Comparative example 3 | PET | PEN | Titanium oxide | — | 64 | 18 | 18 | — | 160 | 230 | −70 | 255 | 263 | 8 |
| Comparative example 4 | PET | PCT/I(16 mol %) | Titanium oxide | — | 64 | 18 | 18 | — | 160 | 157 | 3 | 255 | 258 | 3 |
| Comparative example 5 | PET | PCT/I(5 mol %) | Titanium oxide | — | 64 | 18 | 18 | — | 160 | 140 | 20 | 255 | 280 | 25 |
| Comparative example 6 | PET | PCT/I(5 mol %) | Titanium oxide | — | 64 | 18 | 18 | — | 160 | 140 | 20 | 255 | 280 | 25 |
| Comparative example 7 | PET | PCT/I(5 mol %) | Titanium oxide | — | 64 | 18 | 18 | — | 160 | 140 | 20 | 255 | 280 | 25 |

| | | | | | Features of polyester film or polyester layer (P layer) | | | | |
|---|---|---|---|---|---|---|---|---|---|
| | | | | | | Number of B layers in thickness direction (number/μm) | Proportion of particles being present in or being in contact with dispersion phases (%) | Average relative reflectance in 400-700 nm (%) | Film Mechanic characteristic | |
| | ηA (poise) | ηB (poise) | ηA/ηB | Stretch ratio (MD × TD) | Degree of flatness | | | | After moist heat resistance test | After weather resistance test |
| Example 1 | 3200 | 12000 | 0.27 | 3.3 × 3.8 | 12 | 2.4 | 85 | 86 | A | A |
| Example 2 | 3200 | 12000 | 0.27 | 3.3 × 3.5 | 9.5 | 2.2 | 85 | 85 | A | A |
| Example 3 | 3200 | 12000 | 0.27 | 3.3 × 3.3 | 5.5 | 2.1 | 85 | 84 | B | A |
| Example 4 | 3200 | 12000 | 0.27 | 3.2 × 3.2 | 4.5 | 2 | 85 | 84 | B | A |
| Example 5 | 3200 | 12000 | 0.27 | 3.0 × 3.0 | 3.5 | 1.72 | 85 | 83 | C | A |
| Example 6 | 3200 | 9600 | 0.33 | 3.3 × 3.8 | 7 | 2.6 | 85 | 85 | B | A |
| Example 7 | 3200 | 7000 | 0.46 | 3.3 × 3.8 | 3.5 | 2.6 | 85 | 85 | C | A |
| Example 8 | 3200 | 14000 | 0.23 | 3.3 × 3.8 | 13.7 | 2.4 | 85 | 85 | S | A |
| Example 9 | 3200 | 12000 | 0.27 | 3.3 × 3.8 | 12 | 4.8 | 90 | 86 | S | C |
| Example 10 | 3200 | 12000 | 0.27 | 3.3 × 3.8 | 12 | 3.9 | 90 | 86 | S | B |
| Example 11 | 3200 | 12000 | 0.27 | 3.3 × 3.8 | 12 | 0.9 | 75 | 84 | B | A |
| Example 12 | 3200 | 12000 | 0.27 | 3.3 × 3.8 | 12 | 0.4 | 70 | 84 | C | A |
| Example 13 | 3200 | 12000 | 0.27 | 3.3 × 3.8 | 12 | 2.4 | 85 | 84 | A | A |
| Example 14 | 3200 | 12000 | 0.27 | 3.3 × 3.8 | 12 | 2.4 | 85 | 84 | A | A |
| Example 15 | 3200 | 12000 | 0.27 | 3.3 × 3.8 | 12 | 2.4 | 85 | 85 | A | A |
| Example 16 | 3200 | 12000 | 0.27 | 3.3 × 3.8 | 12 | 2.4 | 70 | 30 | B | A |
| Example 17 | 3200 | 12000 | 0.27 | 3.3 × 3.8 | 12 | 2.4 | 85 | 5 | A | B |
| Example 18 | 3200 | 12000 | 0.27 | 3.3 × 3.8 | 12 | 2.4 | 85 | 84 | A | B |
| Example 19 | 3200 | 12000 | 0.27 | 3.3 × 3.8 | 12 | 2.4 | 85 | 90 | A | C |
| Example 20 | 3800 | 12000 | 0.32 | 3.3 × 3.8 | 12 | 2.4 | 85 | 84 | A | B |
| Example 21 | 3200 | 12000 | 0.27 | 3.5 × 4.0 | 15 | 2.4 | 85 | 86 | S | A |
| Example 22 | 3200 | 12000 | 0.27 | 3.7 × 4.3 | 20 | 2.4 | 85 | 86 | S | A |
| Example 23 | 3200 | 12000 | 0.27 | 3.3 × 3.8 | 12 | 2.4 | 85 | 84 | A | A |
| Example 24 | 3200 | 12000 | 0.27 | 3.3 × 3.8 | 12 | 2.4 | 85 | 84 | A | A |
| Example 25 | 3200 | 12000 | 0.27 | 3.3 × 3.8 | 12 | 2.4 | 85 | 84 | A | A |
| Example 26 | 3200 | 12000 | 0.27 | 3.3 × 3.8 | 12 | 2.4 | 85 | 84 | A | A |
| Example 27 | 3200 | 12000 | 0.27 | 3.3 × 3.8 | 12 | 2.4 | 85 | 84 | A | A |
| Comparative example 1 | 3200 | 12000 | 0.27 | 3.3 × 3.8 | 12 | 2.4 | — | 20 | A | D |
| Comparative example 2 | 3200 | 3200 | 1.00 | 3.3 × 3.8 | — | 0 | — | 84 | D | A |
| Comparative example 3 | 3200 | 3800 | 0.84 | 3.3 × 3.8 | — | 0 | — | 84 | D | B |
| Comparative example 4 | 3200 | 4500 | 0.71 | 3.3 × 3.8 | 2 | 3 | 85 | 85 | D | A |
| Comparative example 5 | 3200 | 12000 | 0.27 | 3.3 × 3.8 | 12 | 2.4 | 40 | 84 | D | A |
| Comparative example 6 | 3200 | 12000 | 0.27 | 3.3 × 3.8 | 12 | 2.4 | 50 | 84 | D | A |
| Comparative example 7 | 3200 | 12000 | 0.27 | 3.3 × 3.8 | 10 | 2.6 | 35 | 84 | D | A |

TABLE 1-continued

| | Film | Backsheet | | |
| --- | --- | --- | --- | --- |
| | | Mechanic characteristic | | |
| | Anti-curl characteristic | After moist heat resistance test | After weather resistance test | Adherence |
| Example 1 | S | A | A | C |
| Example 2 | S | A | A | C |
| Example 3 | S | B | A | C |
| Example 4 | S | B | A | C |
| Example 5 | S | C | A | C |
| Example 6 | S | B | A | C |
| Example 7 | S | C | A | C |
| Example 8 | S | S | A | C |
| Example 9 | S | S | C | C |
| Example 10 | S | S | B | C |
| Example 11 | S | B | A | C |
| Example 12 | S | C | A | C |
| Example 13 | C | A | A | S |
| Example 14 | S | A | A | C |
| Example 15 | S | A | A | C |
| Example 16 | S | B | A | C |
| Example 17 | S | A | B | S |
| Example 18 | S | A | B | C |
| Example 19 | S | A | C | C |
| Example 20 | S | A | B | C |
| Example 21 | S | S | A | C |
| Example 22 | S | S | A | C |
| Example 23 | B | A | A | S |
| Example 24 | S | A | A | S |
| Example 25 | S | A | A | S |
| Example 26 | S | A | A | B |
| Example 27 | S | A | A | C |
| Comparative example 1 | S | A | D | S |
| Comparative example 2 | S | D | A | C |
| Comparative example 3 | S | D | B | C |
| Comparative example 4 | S | D | A | C |
| Comparative example 5 | S | D | A | C |
| Comparative example 6 | S | D | A | C |
| Comparative example 7 | S | D | A | C |

INDUSTRIAL APPLICABILITY

The polyester film is a polyester film that is excellent in the compatibility between the moist heat resistance and other characteristics (in particular, the light resistance, light reflecting characteristic and the like), and that is able to maintain a mechanical strength even if it is exposed to a severe atmosphere such as in an outdoor use or the like, for a long time. By utilizing such characteristics, the film can be suitably used for uses represented by electrical insulation materials of a solar battery backsheet, a planar heat generator element, a flat cable and the like as well as a capacitor material, a motor vehicle-purpose material and a building material.

The invention claimed is:

1. A polyester film comprising particles and two kinds of crystalline polyester resins in which a sea-island structure is formed, wherein, if a crystallization temperature of a crystalline polyester resin A that forms a continuous phase or matrix phase in the polyester film is represented by TccA and a crystallization temperature of a crystalline polyester resin B that forms a dispersion phase or domain phase in the polyester film is represented by TccB, expression (1) below is satisfied, a degree of flatness of the dispersion phase is 3 or more, 70% or more of a total number of the particles present in the dispersion phase or are in contact with the dispersion phase, and the dispersion phase is 0.1/μm to 5/μm in terms of an average number of dispersion phases per unit of 1 μm in a length in a film thickness direction:

$$TccA - TccB \geq 5° C. \qquad \text{Expression (1).}$$

2. The polyester film according to claim 1, wherein a polyester constituting the crystalline polyester resin B contains a cyclohexylene dimethylene terephthalate unit in an amount of 85 mol % relative to all of repetition units.

3. The polyester film according to claim 1, wherein the particles are contained in the polyester film in an amount of 0.5 to 30% by weight.

4. The polyester film according to claim 1, whose elongation retention rate after the polyester film is treated for 48 hours in an atmosphere having a temperature of 125° C. and a relative humidity of 100% RH is greater than or equal to 30%, and whose elongation retention rate after the polyester film is irradiated for 48 hours with a metal halide lamp having an intensity of 100 mW/cm$^2$ (wavelength range=295 to 450 nm, peak wavelength=365 nm) in an atmosphere having a temperature of 60° C., and 50% RH is greater than or equal to 20%.

5. A laminate film in which the film according to claim 1 is layered on another film.

6. The laminate film according to claim 5, wherein the polyester film is layered as an outermost layer on at least one side.

7. A solar battery backsheet comprising the polyester film according to claim 1.

8. A solar battery backsheet comprising the laminate film according to claim 5.

9. A solar battery comprising the solar battery backsheet according to claim 8.

* * * * *